United States Patent
Miyamoto et al.

(10) Patent No.: US 7,863,648 B2
(45) Date of Patent: Jan. 4, 2011

(54) FIELD EFFECT TRANSISTOR

(75) Inventors: Hironobu Miyamoto, Tokyo (JP); Yuji Ando, Tokyo (JP); Yasuhiro Okamoto, Tokyo (JP); Tatsuo Nakayama, Tokyo (JP); Takashi Inoue, Tokyo (JP); Kazuki Ota, Tokyo (JP); Akio Wakejima, Tokyo (JP); Kensuke Kasahara, Tokyo (JP); Yasuhiro Murase, Tokyo (JP); Kohji Matsunaga, Tokyo (JP); Katsumi Yamanoguchi, Tokyo (JP); Hidenori Shimawaki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 11/921,854

(22) PCT Filed: Jun. 12, 2006

(86) PCT No.: PCT/JP2006/311745

§ 371 (c)(1),
(2), (4) Date: Dec. 15, 2008

(87) PCT Pub. No.: WO2006/132418

PCT Pub. Date: Dec. 14, 2006

(65) Prior Publication Data

US 2009/0230429 A1    Sep. 17, 2009

(30) Foreign Application Priority Data

Jun. 10, 2005    (JP)    ............................. 2005-171706

(51) Int. Cl.
*H01L 29/812* (2006.01)
*H01L 21/338* (2006.01)

(52) U.S. Cl. .................. 257/192; 257/189; 257/194; 257/E29.246; 257/E21.403; 257/E21.407

(58) Field of Classification Search ................. 257/192, 257/194, E29.255, E29.246–E29.247, E21.403, 257/E21.407, 189
See application file for complete search history.

(56) References Cited

U.S. PATENT DOCUMENTS 6,100,571 A * 8/2000 Mizuta et al. ............... 257/488

(Continued)

FOREIGN PATENT DOCUMENTS

JP        57-104259        6/1982

(Continued)

OTHER PUBLICATIONS

Okamoto et al., "Improved Power Performance for a Recessed-Gate AlGaN-GaN Heterojunction FET with a Field-Modulating Plate," IEEE Trans., vol. 52, No. 11, pp. 2536-2540 (Nov. 2004).

(Continued)

*Primary Examiner*—Zandra V. Smith
*Assistant Examiner*—Jeremy J Joy
(74) *Attorney, Agent, or Firm*—Young & Thompson

(57) ABSTRACT

A field effect transistor (100) exhibiting good performance at high voltage operation and high frequency includes a first field plate electrode (116) and a second field plate electrode (118). The second field plate electrode includes a shielding part (119) located in the region between the first field plate electrode and a drain electrode (114), and serves to shield the first field plate electrode from the drain electrode. When in the cross sectional view in the gate length direction, the length in the gate length direction of an overlap region where the second field plate electrode (118) overlap the upper part of a structure including the first field plate electrode and a gate electrode (113) is designated as Lol, and the gate length is Lg, the relation expressed as $0 \leq Lol/Lg \leq 1$ holds.

15 Claims, 12 Drawing Sheets

U.S. PATENT DOCUMENTS

| | | | |
|---|---|---|---|
| 6,703,678 B2 | 3/2004 | Hirokawa et al. | |
| 6,933,544 B2* | 8/2005 | Saito et al. | 257/194 |
| 7,256,432 B2* | 8/2007 | Okamoto et al. | 257/192 |
| 7,501,669 B2* | 3/2009 | Parikh et al. | 257/194 |
| 7,573,078 B2* | 8/2009 | Wu et al. | 257/194 |
| 2002/0171096 A1 | 11/2002 | Wakejima et al. | |
| 2005/0051796 A1* | 3/2005 | Parikh et al. | 257/192 |
| 2005/0062069 A1 | 3/2005 | Saito et al. | |
| 2005/0087765 A1* | 4/2005 | Saito et al. | 257/192 |
| 2005/0253167 A1* | 11/2005 | Wu et al. | 257/192 |
| 2005/0253168 A1* | 11/2005 | Wu et al. | 257/192 |
| 2006/0043415 A1* | 3/2006 | Okamoto et al. | 257/192 |
| 2006/0102929 A1 | 5/2006 | Okamoto et al. | |
| 2007/0114569 A1* | 5/2007 | Wu et al. | 257/194 |
| 2007/0235761 A1* | 10/2007 | Parikh et al. | 257/194 |
| 2009/0230430 A1* | 9/2009 | Miyamoto et al. | 257/192 |

FOREIGN PATENT DOCUMENTS

| | | |
|---|---|---|
| JP | 3111985 | 9/2000 |
| JP | 3180776 | 4/2001 |
| JP | 2001-144106 A | 5/2001 |
| JP | 2001-230263 | 8/2001 |
| JP | 2001-118122 A | 4/2002 |
| JP | 2002-353444 | 12/2002 |
| JP | 2004-200248 A | 7/2004 |
| JP | 2004-221344 | 8/2004 |
| JP | 2004-327919 | 11/2004 |
| JP | 2005-093864 | 4/2005 |
| JP | 2005-93864 A | 4/2005 |
| WO | WO 2004061978 A1 * | 7/2004 |
| WO | 2004/068590 A | 8/2004 |
| WO | WO 2004068590 A1 * | 8/2004 |
| WO | 2005/024909 | 3/2005 |

OTHER PUBLICATIONS

Ishikura et al., "A 28V over 300 W GaAs Heterojunction FET with Dual Field-Modulating Plates for W-CDMA Base Stations," 2005 IEEE MTT-S Int'l Microwave Symposium, vol. 2, pp. 823-826 (Jun. 2005).

Huili Xing et al., IEEE Electron device Letters, vol. 25, No. 4, pp. 161-163 (2004).

S. Mil'shtein, Microelectronics Journal, vol. 36, pp. 319-322 (2005) (published online Apr. 19, 2005).

W. Saito et al., Japanese Journal of Applied Physics, vol. 43, No. 4B, pp. 2239-2242 (2004).

Okamoto et al., IEEE Transaction on Microwave Theory and Techniques, vol. 52, No. 11, pp. 2536-2540 (2004).

Y.-F. Wu et al., IEEE Electron device Letters, vol. 25, No. 3, pp. 117-119 (2004).

European Patent Office issued an European Search Report dated Jun. 17, 2009, Application No. 06766607.3.

Chinese Patent Office issued a Chinese Office Action dated Sep. 4, 2009, Application No. 2006800291922.

Chinese Patent Office issued a Chinese Office Action dated Dec. 18, 2009, Application No. 200680029192.2.

* cited by examiner (a)

Measured for operation at 50 V
Wg=2mm
Vdd=50V (b)

| Lfd (μm) | 0 | 0.2 | 0.5 | 0.7 | 1.0 | 1.5 |
|---|---|---|---|---|---|---|
| Turning point (GHz) | 13 | 11 | 10 | 3 | 2 | 2 |

FIELD EFFECT TRANSISTOR

TECHNICAL FIELD

The present invention relates to a field effect transistor using Group III nitride semiconductor. In particular, the present invention relates to a structure fit for attaining excellent high frequency characteristic and high voltage performance in a hetero-junction field effect transistor utilizing Group III nitride semiconductor.

RELATED ART

As a field effect transistor using Group III nitride semiconductor, there has been reported a field effect transistor as shown in FIG. 17 (Non-Patent Document 1: Y. Ando, et al., 2001 International Electron Devices Meeting Digest (IEDM 01) pp. 381-384). FIG. 17 is a cross sectional view showing the structure of a Hetero-Junction Field Effect Transistor (which will be simply referred to as HJFET hereinafter).

In this HJFET 200, an AlN buffer layer 211 is formed on a sapphire substrate 209. A GaN channel layer 212 is formed on the AlN buffer layer 211, and an AlGaN electron supply layer 213 is formed thereon. A source electrode 201 and a drain electrode 203 are formed on the AlGaN electron supply layer 213. These electrodes are in ohmic-contact with the AlGaN electron supply layer 213. Further, a gate electrode 202 is formed between the source electrode 201 and the drain electrode 203. This gate electrode 202 is in Schottky contact with the AlGaN electron supply layer 213. In final, a SiN film 221 functioning as a surface protective film is formed as the uppermost layer.

In such HJFET 200, since the transistor has AlGaN/GaN hetero-junction therein, trade-off exists between level of collapse and gate breakdown voltage, and control of the trade-off is very difficult. At the AlGaN/GaN hetero-junction, piezo-electric polarization is induced by stress resulting from lattice mismatch between the AlGaN layer and the GaN layer, and thereby two-dimensional electron gas is supplied to the interface between the AlGaN electron supply layer 213 and the GaN channel layer 212. For this reason, when a protective film (SiN film 221) to produce stress is formed on the device surface, the resulted stress has an influence on the device performance of the HJFET 200. This influence will be described below.

FIG. 18 shows the relationship between thickness of the SiN film 221 and level of collapse (shown with ○ in the figure) and gate breakdown voltage (shown with Δ in the figure). In this case, the collapse is the phenomenon that when the HJFET performs a large signal operation, there results the state where negative charges are accumulated on the surface due to response of surface traps so that the maximum drain current is lowered. When level of the collapse becomes significant, a drain current at large signal operation is suppressed, and thus, a saturated output is lowered.

When the SiN film 221 is formed on the surface of such a device in which the level of collapse is significant, piezo polarization charges in the AlGaN electron supply layer 213 are increased by stress due to the SiN film 221, resulting in an effect to compensate the surface negative charges. For this reason, the level of collapse can be reduced. For example, in the case where there was no SiN film 221 in FIG. 18, i.e., in the case where the film thickness thereof is 0 nm, the level of collapse was 60% or more. On the contrary, in the case where the film thickness of the SiN film 221 was 100 nm, the level of collapse can be held down to 10% or less.

On the other hand, the aforementioned surface negative charges have an effect to relieve electric field concentration between the gate and the drain, and thus to heighten gate breakdown voltage. For this reason, when the SiN film 221 is thickened so that surface negative charges are compensated away, electric field concentration between the gate and the drain becomes serious so that gate breakdown voltage is lowered.

As a result, as shown in FIG. 18, trade-off exists between collapse and gate breakdown voltage depending upon differences of the thickness of the SiN film 221.

To solve such problems in the HJFET, there has been proposed an HJFET to which a field plate electrode is added (Non-Patent Document 2: Li et al., Electronic Letters, vol. 37, pp. 196-197 (2001)). FIG. 19 is a cross sectional view showing the structure of such an HJFET.

An HJFET 250 shown in FIG. 19 is formed on a substrate such as SiC substrate 210. An AlN buffer layer 211 is formed on the SiC substrate 210. A GaN channel layer 212 is formed on the AlN buffer layer 211. An AlGaN electron supply layer 213 is formed on the GaN channel layer 212. A source electrode 201 and a drain electrode 203 are provided on the AlGaN electron supply layer 213, which are in ohmic-contact therewith. Between these electrodes 201 and 203, a gate electrode 202 is provided. The gate electrode 202 comprises a field plate part 205 protruded in a form of overhanging toward the drain side, and is in Schottky-contact with the AlGaN electron supply layer 213. The surface of the AlGaN electron supply layer 213 is covered by a SiN film 221. Immediately below the field plate part 205, this SiN film 221 is lying.

Since lowering of the breakdown voltage can be suppressed by adding the field plate part 205, improvement in trade-off between collapse and gate breakdown voltage can be made.

DISCLOSURE OF THE INVENTION

Problems to be Solved by the Invention

However, as the result of the fact that the inventors have studied the HJFET 250 which has been previously described with reference to FIG. 19, it has been found that when an operation is performed, for instance, at a high voltage of 60 V or more, collapse is observed again so that such a high output density that is expected at a high voltage operation of 60 V or more cannot be attained.

Moreover, it has been reported that in the case where the field plate is provided, feedback capacity due to parasitic capacity immediately below the field plate electrode becomes large as shown in FIGS. 16 and 20 so that gain is lowered as compared to the case where no field plate is provided (Non-Patent Document 3: Ando, et al., Workshop of the Institute of Electronics, Information and Communication Engineers, January 2003). FIG. 16 is a drawing for explaining lines of electric force between the gate and the drain of an HJFET comprising the SiN film 221 and a field plate. Moreover, FIG. 20 is a chart showing the relationship between operating voltage and gain of the transistor. In FIG. 20, LFP indicates length of the field plate electrode, and is 1 μm in this example.

Further, in Patent Document 1: JP 2005-93864 A, there is disclosed a power semiconductor device comprising plural field plates. In accordance with this power semiconductor device, an interposer electrode part of a second field plate electrode is interposed between a first field plate electrode and a drain electrode to thereby substantially cancel gate-drain capacity.

However, as the result of the fact that the inventors have studied the structure described in the aforementioned document (Patent Document 1: JP 2005-93864 A), it has been found out that there is a room for improvement from a viewpoint of improving breakdown voltage while improving gain in a high frequency region.

The present invention has been made in view of the aforementioned circumstances, and provides a field effect transistor exhibiting a satisfactory high frequency characteristic and an excellent breakdown voltage in high voltage operating.

Means for Solving the Problems

The inventors have energetically conducted studies with the view of improving gain in a high frequency region of a field effect transistor to improve its high frequency characteristic and improving a breakdown voltage characteristic. In particular, we have studied the relationship between frequency f and linear gain (hereinafter simply referred to as "gain") in connection with the transistor (shown in FIG. 19) comprising a field plate for ensuring gate breakdown voltage. In transistors, it is known that there exists a "turning point" where gain is rapidly lowered when an operating frequency is above a certain frequency. Since a field effect transistor is used on the lower frequency side relative to the turning point, when the turning point exists on the lower frequency side, an upper limit of a usable frequency would be lowered.

FIG. 21 is a chart for explaining a turning point. As indicated by solid line in the figure, frequency fc is the turning point. On the high frequency side relative thereto, gain is remarkably lowered. From this fact, it is understood that it is necessary for improving the high frequency characteristic to improve the gain, and to allow the turning point to be located on the high frequency side.

Moreover, in Patent Document 1: JP 2005-93864 A which has been previously described in the section of the problems to be solved, there is described a power HEMT in which a second field plate electrode is formed from the upper surface of the first field plate electrode toward the upper surface of the source electrode. In this power HEMT, the second field plate electrode and the source electrode are electrically connected in the operation region, and these electrodes are biased at the same electric potential. In view of the above, as the result of the fact that the inventors have then studied such transistor, in the case where the second field plate electrode is provided from the first field plate electrode toward the source electrode, it has been newly found as indicated by dotted lines in FIG. 21 that while gain in the low frequency region is improved, the turning point would shift toward the lower frequency side (fc' in the figure).

In view of the above, the inventors have further studied the cause of shift of the turning point. As a result, the inventors have newly obtained the finding that when the length of the overlap region of a structure comprising the gate electrode and the first field plate and the second field plate is larger than the gate length, the turning point shifts toward the low frequency side.

In this specification, It is to be noted that, in the cross sectional view in the gate length direction, the overlap region is a region where the second field plate is placed above the structure comprising the first field plate and the gate electrode, and is a region where the second field plate and the structure overlap with each other in the gate length direction. As described later in the examples, since when the overlap region is longer than the gate length, the turning point shifts toward the low frequency side, there is conceived a tendency such that gain in the high frequency region is remarkably lowered.

On the basis of the aforementioned findings, the inventors have studied transistors which are excellent in the breakdown voltage characteristic, and have high gain and a turning point located on the high frequency side. As a result, it has been found out that, in a field effect transistor comprising a dual field plate structure, when the overlap region of the field plate electrode is formed in a specific structure, and a shielding part is provided in the second field plate, such a desired transistor can be realized.

The present invention has been made on the basis of such new findings.

In accordance with the present invention, there is provided a field effect transistor comprising:

a layer structure made of Group III nitride semiconductor comprising hetero-junction;

a source electrode and a drain electrode formed on the layer structure made of Group III nitride semiconductor with a space separating each other;

a gate electrode placed between the source electrode and the drain electrode;

a first field plate placed over the layer structure made of Group III nitride semiconductor in a region between the gate electrode and the drain electrode, and isolated from the layer structure made of Group III nitride semiconductor; and a second field plate placed over the layer structure made of Group III nitride semiconductor, and isolated from the layer structure made of Group III nitride semiconductor and the first field plate, wherein the second field plate comprises a shielding part located in a region between the first field plate and the drain electrode, and serving to shield the first field plate from the drain electrode, and an upper end of the shielding part is located above an upper surface of the first field plate, whereby, in a cross sectional view in the gate length direction, when a length in a gate length direction of an overlap region where the second field plate overlaps an upper part of a structure comprising the first field plate and the gate electrode is designated as Lol and a gate length is designated as Lg, the relation expressed below is satisfied:

$$0 \leq Lol/Lg \leq 1.$$

The field effect transistor according to the present invention comprises, over the Group III nitride semiconductor structure, the second field plate that is isolated from the upper part of the layer structure made of Group III nitride semiconductor and the first field plate, wherein the second field plate comprises the shielding part. Further, the shielding part is placed in the region between the first field plate and the drain electrode so as to shield the first field plate from the drain electrode, and the upper end of the shielding part is located above the upper surface of the first field plate.

Here, in the region on the drain electrode side, since the corner part of the upper part of the first field plate is a part where lines of electric force concentrate, it is important for reducing parasitic capacity thereof to securely shield this part. In the field effect transistor of the present invention, the aforementioned structure is employed to provide the second field plate at the side part of the first field plate so as to overlay over the region from the side surface of the first field plate toward the upper part thereof via the upper end thereof. By using such a structure, the upper corner part of the first field plate can be securely shielded to suppress occurrence of parasitic capacity.

In this specification, the shielding part means a part in the second field plate used for shielding an electric field between the first field plate and the drain electrode. The shielding part may be constructed so as to substantially completely shield the electric field, or may be constructed so as to shield a portion thereof. The entirety of the second field plate may be used as the shielding part, or a portion thereof may be used as the shielding part. Moreover, in this specification, locating "above" refers to locating on the side away from the layer structure made of Group III nitride semiconductor and locating "below" refers to locating on the side of the layer structure made of Group III nitride semiconductor.

Further, in the field effect transistor of the present invention, the length Lol in the gate length direction of the overlap region is chosen so as to satisfy the following relation:

$$0 \leq Lol/Lg \leq 1.$$

By choosing as 0=Lol, occurrence of parasitic capacity between the structure comprising the gate electrode and the first field plate and the second field plate can be more securely suppressed, and thus, shift toward the lower frequency side of the turning point can be more securely suppressed. Therefore, it is possible to more securely suppress lowering of gain in the high frequency region. For this reason, it is possible to securely improve the high frequency characteristic.

Moreover, by choosing as $0 \leq Lol/Lg \leq 1$, electric field concentration between the gate electrode and the drain electrode can be more stably relieved, and thereby the turning point can be retained on the high frequency side. Thus, the field effect transistor of the present invention is constructed in the structure being excellent in the high frequency characteristic.

In the field effect transistor of the present invention, there may be employed such a structure in which the lower end of the shielding part is located on the side of the layer structure made of Group III nitride semiconductor relative to the lower end of the first field plate. By choosing such a structure, it is possible to more effectively shield the first field plate from the drain electrode.

In this specification, the lower end of the shielding part is, e.g., a lower surface of the shielding part. In the case where the lower surface of the shielding part comprises offset or inclination, the lower end of the shielding part refers to the end part thereof being located on the side of the layer structure made of Group III nitride semiconductor.

In this structure, there may be employed a structure in which the field effect transistor further comprises a first insulating film for covering the upper surface of the layer structure made of Group III nitride semiconductor in the region between the gate electrode and the drain electrode, wherein a recessed part is provided at the first insulating film in the region between the first field plate and the drain electrode, and the first field plate is provided in a manner in contact with an upper surface of the first insulating film, and the lower end of the shielding part is located within the recessed part. By choosing such a structure, the field effect transistor in which the lower end of the shielding part is located on the side of the Group III semiconductor layer structure relative to the lower end of the first field plate can be constructed in the structure which is more excellent in the manufacturing stability.

Moreover, in the field effect transistor of the present invention, there may be also employed a structure in which the lower end of the first field plate is located on the side of the layer structure made of Group III nitride semiconductor relative to the lower end of the shielding part. By employing such a structure, the level of effect of the field plate on the drain side (between the gate electrode and the drain electrode) can be moderated to provide an ideal electric field distribution. For this reason, it is possible to effectively make improvement in the breakdown voltage characteristic, while reduction in the high frequency characteristic is suppressed within a minimum level. Namely, electric field change on the upper surface of the layer structure made of Group III nitride semiconductor, which is caused by the shielding part of the second field plate, can be adjusted within an appropriate range, and thus, an ideal electric field distribution can be made up on the drain side (between the gate electrode and the drain electrode).

In this structure, the field effect transistor may comprise the first insulating film for covering the surface of the layer structure made of Group III nitride semiconductor in the region between the gate electrode and the drain electrode, and a second insulating film provided on the first insulating film in the region between the first field plate and the drain electrode, wherein the first field plate may be provided in a manner in contact with the upper surface of the first insulating film, and the lower end of the shielding part is in contact with the upper surface of the second insulating film. By choosing such a structure, the distance between the field plate and the layer structure made of Group III nitride semiconductor is adjusted, thereby making it possible to adjust the value of electrostatic capacity. For this reason, while reduction in the high frequency characteristic is suppressed within a minimum level, a field effect transistor effectively improving in the breakdown voltage characteristic can be constructed in such a structure which can be further stably manufactured.

Effect of Invention

As described above, in accordance with the present invention, a field effect transistor exhibiting both good performance under high voltage and high frequency operation condition can be realized.

Figure 1:
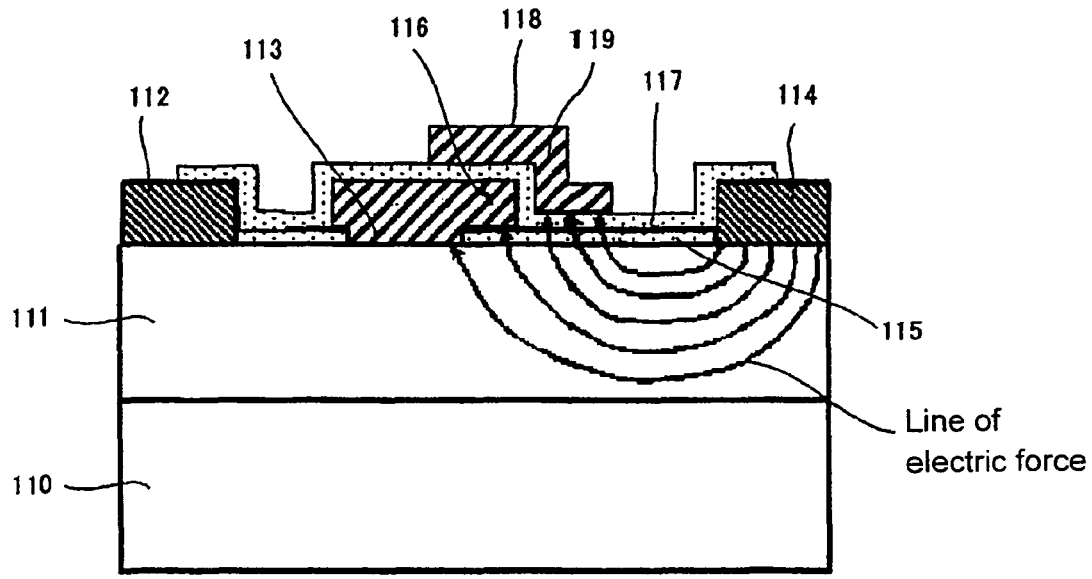
FIG. 1 is a cross sectional view schematically showing the structure of a field effect transistor according to an exemplary embodiment of the present invention, and lines of electric force reflecting an electric field distribution in the gate-drain region thereof.

In the aforementioned drawings, reference symbols described below have the following meanings.

100 Field Effect Transistor
110 Substrate
111 Nitride semiconductor
112 Source electrode
113 Gate electrode
114 Drain electrode
115 First insulating film
116 First field plate electrode
117 Second insulating film
118 Second field plate electrode
119 Shielding part
131 AlN buffer layer
132 GaN layer
133 AlGaN layer

BEST MODE FOR CARRYING OUT THE INVENTION

Exemplary embodiments of the present invention will now be explained with reference to the drawings. In all the drawings, the same reference symbols are respectively attached to common structural elements, and explanations common therefor in the following disclosures will be omitted as occasion demands.

In the exemplary embodiments illustrated below, the advantages that the present invention exhibits and preferred modes thereof are shown by referring to an FET where the operation mode is "Depletion mode", particularly an HJFET.

First Exemplary Embodiment

FIG. 1 is a cross sectional view showing the structure of a nitride semiconductor field effect transistor of the present exemplary embodiment. The field effect transistor 100 shown in FIG. 1 is a transistor which is of HJFET type using nitride semiconductor with a dual field plate structure.

This transistor comprises a layer structure made of Group III nitride semiconductor (nitride semiconductor 111) comprising hetero-junction, a source electrode 112 and a drain electrode 114 which are formed on a upper part of the nitride semiconductor 111 in a spaced manner, a gate electrode 113 placed between the source electrode 112 and the drain electrode 114, a first field plate (first field plate electrode 116) provided above the nitride semiconductor 111 in the region between the gate electrode 113 and the drain electrode 114 and isolated from the nitride semiconductor 111, and a second field plate (second field plate electrode 118) provided above the nitride semiconductor 111 and isolated from the nitride semiconductor 111 and the first field plate electrode 116.

The second field plate electrode 118 comprises a shielding part 119 located in the region between the first field plate electrode 116 and the drain electrode 114, and serving to shield the first field plate electrode 116 from the drain electrode 114. Moreover, the second field plate electrode 118 comprises an offset portion in the cross sectional view in the gate length direction, wherein a part of vertical type connecting one step and another step serves as the shielding part 119.

The upper end of the shielding part 119 is located above the upper surface of the first field plate electrode 116, i.e., on the side away from the nitride semiconductor 111.

In the cross sectional view in the gate length direction, when the length in the gate length direction of the overlap region where the second field plate electrode 118 overlaps the upper part of a structure comprising the first field plate electrode 116 and the gate electrode 113 is designated as Lol, and a gate length is designated as Lg, the relation expressed below is satisfied:

$$0 \leq Lol/Lg \leq 1.$$

For example, Lol=0, i.e., Lol/Lg=0 may be selected.

In FIG. 1, the second field plate electrode 118 is provided in a manner in contact with an insulating film of one layer (second insulating film 117) for covering the side surface of the first field plate electrode 116. The second field plate electrode 118 overlaps also with the insulating film (second insulating film 117) provided from the side surface of the first field plate electrode 116 toward the upper surface thereof.

The field effect transistor 100 comprises a first insulating film (first insulating film 115) for covering the surface of the nitride semiconductor 111 in the region between the gate electrode 113 and the drain electrode 114, and a second insulating film (second insulating film 117) provided on the first insulating film 115 in the region between the first field plate electrode 116 and the drain electrode 114, wherein the first field plate electrode 116 is provided in a manner in contact with a part on the first insulating film 115, and the lower end of the shielding part 119 is in contact with an upper surface of the second insulating film 117. This is the construction in which the lower end of the first field plate electrode 116 is located on the side of the nitride semiconductor 111 relative to the lower end of the shielding part 119.

The first field plate electrode 116 is biased at the same electric potential as that of the gate electrode 113. On the other hand, the second field plate electrode 118 is biased at the same electric potential as that of the source electrode 112. In particular, the source electrode 112 and the second field plate electrode 118 are formed in such a form that they are electrically independent from each other in the operation region. In the cross sectional view of the operation region, the source electrode 112 and the second field plate electrode 118 are shaped in separate form, but the source electrode 112 and the second field plate electrode 118 are electrically connected in an isolation region.

The first field plate electrode 116 is constructed in a manner integrally continuous to the gate electrode 113. In this specification, "integrally continuous" refers to the state integrally formed as a continuous body. Moreover, it is preferable to employ a structure made of a single member and containing no connection part therein.

While, in the structure shown in FIG. 1, the second field plate electrode 118 and the first field plate electrode 116 overlap with each other, and the second field plate electrode 118 and the gate electrode 113 also overlap with each other, there may be employed a structure in which the second field plate electrode 118 and the first field plate electrode 116 overlap with each other, but the second field plate electrode 118 and the gate electrode 113 do not overlap with each other.

Moreover, when, in the cross sectional view in the gate length direction, a gate length is designated as Lg, the extension width in a gate length direction of the first field plate electrode 116 from the gate electrode 113 end part toward the drain electrode 114 is designated as Lfp1, the length in the gate length direction of the lower surface of the second field plate electrode 118, i.e., the length in the gate length direction of the lower surface of the second field plate 118 from the gate side end part of the shielding part 119 up to the drain side end part of the second field plate electrode 118 is designated as Lfp2, the structure may be constructed in such a shape in which the following formula (1) is satisfied.

$$0.5 \times Lfp1 \leq Lfp2 \quad (1)$$

Moreover, there may be also employed a structure in which second field plate electrode 118 is provided in a manner in contact with the second insulating film 117 for covering the side surface of the gate electrode 113, whereby, when, in the cross sectional view in the gate length direction, the extension width in the gate length direction of the first field plate electrode 116 from the gate electrode 113 end part toward the drain electrode 114 is designated as Lfp1, the length in the gate length direction of the lower surface of the second field plate electrode 118 is Lfp2, the distance between the gate electrode 113 and the drain electrode 114 is designated as Lgd, and the thickness of the second insulating film 117 at the side surface of the first field plate electrode 116 is designated as d3, the following formulas (1) and (2) are satisfied.

$$0.5 \times Lfp1 \leq Lfp2 \quad (1)$$

$$Lfp1 + Lfp2 + d3 \leq \tfrac{3}{5} \times Lgd \quad (2)$$

Moreover, in the cross sectional view in the gate length direction, when the length in the gate length direction of the lower surface of the second field plate electrode 118 is designated as Lfp2, and the distance between the lower surface of the shielding part 119 of the second field plate electrode 118 in the region between the first field plate electrode 116 and the gate electrode 113 and the nitride semiconductor 111 is designated as d2, the structure may be constructed in such a shape in which the following formula (3) is satisfied.

$$d2 \leq 0.5 \times Lfp2 \quad (3)$$

The first insulating film 115 is to be a film containing nitrogen.

There is employed a form such that only an insulating film exists, e.g., only the first insulating film (the first insulating film 115) exists between the lower surface of the first field plate electrode 116 (first field plate) and the upper surface of nitride semiconductor 111 (nitride semiconductor layer structure). In such a case, the thickness d1 of the first insulating film (first insulating film 115) is selected so that it falls within the range where an electric field formed in the first insulating film (first insulating film 115) resulting from a voltage applied to the first field plate electrode 116 (first field plate) is not above a breakdown electric field strength at which dielectric breakdown of the insulating film takes place. Also when the same voltage as, e.g., a turn-on voltage of about 1 V applied to the gate 113 is applied to the first field plate electrode 116 (first field plate), it is necessary to select such a condition that the thickness be set at least within the range of $d1 \geq 1$ nm, in the case where the first insulating film (the first insulating film 115) is a SiN film, as the condition for keeping the field in the range being not above the breakdown electric field strength. Moreover, when the first field plate electrode 116 (first field plate) is biased at the same electric potential as that of the gate electrode, it is necessary for attaining effective moderation in electric field to select a ratio between Lfp1 and d1 so that it at least falls within the range of $Lfp1 \geq d1$. In general, it is preferable to select the ratio between Lfp1 and d1 so that it falls within the range of $Lfp1 \geq d1 \times (\in_1 / \in_o)$ in performing notation by making use of dielectric constant $\in_1$ of an insulating film utilized for the first insulating film (first insulating film 115) and dielectric constant $\in_0$ in vacuum. For example, in the case where the first insulating film (first insulating film 115) is a SiN film, when dielectric constant of the SiN film is expressed as $\in_{SiN}$, it is preferable to select the ratio between Lfp1 and d1 so that it falls within the range of $Lfp1 \geq d1 \times (\in_{SiN} / \in_0)$.

On the other hand, there is employed a form such that the first field plate electrode 116 (first field plate) and the second field plate electrode 118 (second field plate) are formed in the state where the second insulating film (second insulating film 117) lies therebetween.

The structure of the electric field effect transistor 100 will now be described in more detail.

In the electric field effect transistor 100, source electrode 112 and drain electrode 114 are formed on the surface of the nitride semiconductor 111 which has been grown on the substrate 110. There are formed the gate electrode 113 and the first field plate electrode 116 between which the first insulating film 115 lies, and the first field plate electrode 116 is electrically connected to the gate electrode 113 on the active region or on the isolation region of the device. Further, the device is constructed in a dual field plate structure in which the second field plate electrode 118 is provided adjacent to the first field plate electrode 116 through the second insulating film 117, and the second field plate electrode 118 is electrically connected to the source electrode 112 on the isolation region of the device.

The nitride semiconductor 111 is constructed in such a structure in which, e.g., an AlN buffer layer, a GaN layer and an AlGaN layer are layered up in order recited from the lower side (substrate 110 side).

A material of the substrate 110 is, e.g., SiC, sapphire or Si. Moreover, a substrate made of Group III nitride semiconductor such as GaN or AlGaN may be used.

The first insulating film 115 and the second insulating film 117 are films both containing nitrogen, such as SiN film. By employing such a film structure, these insulating films exhibit further high effect as the surface protective film so that they can further effectively suppress collapse in the HJFET.

In particular, when a SiN film is utilized as the first insulating film 115 (first insulating film) for covering the surface of the nitride semiconductor 111 (the layer structure made of Group III nitride semiconductor), and a SiN film is utilized also as the second insulating film 117 (second insulating film), strain stress induced by the SiN films is applied to the surface of the nitride semiconductor 111 (the layer structure made of Group III nitride semiconductor). As a result, it is effective in current collapse reduction. In addition, by using the SiN film as the first insulating film 115 (first insulating film), there is also an effect to lower density of interface states introduced at the interface between the SiN film and the nitride semiconductor 111 (the layer structure made of Group III nitride semiconductor). When a film containing nitrogen is utilized at least as the first insulating film 115 (first insulating film), there can be avoided a phenomenon in which electron trap state resulting from oxygen is introduced at a high density, which trap state is frequently observed in utilizing, e.g., $SiO_2$ film. For example, a film containing nitrogen may include SiON, BN, AlN, etc. except for SiN. In utilizing these films containing nitrogen other than SiN as the first insulating film 115 (first insulating film), if the direction of strain stress resulting from covering thereof, which is introduced onto the surface of the nitride semiconductor 111 (the layer structure made of Group III nitride semiconductor), is the same direction as in utilizing SiN, it is effective in current collapse reduction.

Moreover, when the magnitude of strain stress introduced onto the surface of the nitride semiconductor 111 (the layer structure made of Group III nitride semiconductor) is smaller than the magnitude of strain stress in utilizing SiN, an additional effect in reduction of gate leakage current is exhibited.

For example, there may be also employed a mode where a SiN film is utilized as the first insulating film 115 (first insulating film), and a film containing nitrogen other than SiN film is utilized as the second insulating film 117 (second insulating film). In such a case, when the direction of strain stress introduced onto the surface of the nitride semiconductor 111 (the layer structure made of Group III nitride semiconductor) is the same as the direction of strain stress in utilizing SiN, the effect of current collapse reduction can be obtained.

It should be noted that when such a film containing nitrogen as SiON, which includes other atoms such as oxygen to form electron trap states in addition to nitrogen, is utilized as the first insulating film 115 (first insulating film), there is the possibility that density of interface states may become higher as compared to the case where SiN is utilized. Also in this instance, the density of interface states introduced is relatively suppressed by utilizing SiON film as compared to the case where $SiO_2$ film is utilized. At the relatively low density of the interface states, even if electrons are trapped in the electron trap states at the interface in the vicinity of the gate electrode, when the first field plate electrode (first field plate) is biased at the same electric potential as that of the gate electrode, the channel part in which electrons are trapped in the electron trap states can be modulated by electric field due to the first field plate electrode (first field plate). As a result, the effect to suppress occurrence of current collapse can be obtained.

In the field effect transistor 100, the second field plate electrode 118 is biased at the same electric potential as that of the source electrode 112, and thereby large part of lines of electric force between the first field plate electrode 116 and the drain electrode 114 are terminated to shield out. Accordingly, feedback capacity between the drain electrode 114 and the gate electrode 113 which is biased at the same electric potential as that of the first field plate 116 can be greatly reduced. Thus, the gain in the high frequency region of the transistor is improved. Further, the first field plate electrode 116 which is biased at the same electric potential as that of the gate electrode 113 through the second insulating film 117 with dielectric constant higher than that of air, and the second field plate electrode 118 which is biased at the same electric potential as that of the source electrode 112 are disposed in order in the drain electrode 114 direction. Thus, electric field concentration in the vicinity of the gate electrode 113 is greatly moderated as compared to the case of the conventional type of structure comprising only the first field plate electrode 116. Accordingly, the transistor can be operated at a higher drain voltage.

Moreover, in the field effect transistor 100, the second field plate electrode 118 is not formed on the surface of the nitride semiconductor 111, but is instead formed on the second insulating film 117. For this reason, in performing a large signal operation, injection of electrons from the second field plate electrode 118 onto the surface of the nitride semiconductor 111 can be suppressed down to a low level. When electrons are injected, there results the state where negative charges are accumulated at surface trap states. As a result, a phenomenon where maximum drain current is reduced (virtual gate phenomenon) takes place. For this reason, by using the structure of this exemplary embodiment, it is possible to suitably suppress the performance deterioration resulting from the virtual gate phenomenon, which is caused by the injection of negative charges in the nitride semiconductor transistor.

Further, the field effect transistor 100 is constructed in such a structure that, between the length Lol in the gate length direction of the overlap region where the first field plate electrode 116 and the gate electrode 113, and the second field plate electrode 118 overlap with each other and the gate length Lg, the relations expressed below hold:

$$Lol = 0, \text{ or} \qquad (i)$$

$$0 < Lol/Lg \leq 1. \qquad (ii)$$

In the cross sectional view in the gate length direction, the overlap region is defined as the region where the second field plate electrode 118 and the structure comprising the first field plate electrode 116 and the gate electrode 113 overlap with each other in the gate length direction.

By choosing such a structure where the overlap region satisfies the aforementioned relation (ii), the turning point of gain can exist on the high frequency side. Thus, lowering of gain in the high frequency region can be suppressed to improve the high frequency characteristic, and the first field plate electrode 116 can be further securely shielded from the drain electrode 114. Further, by selecting the ratio between Lol and Lg within the aforementioned range, the magnitude of excess parasitic capacity between the gate and the source can be sufficiently lowered with respect to true capacity originated from the gate length Lg of the gate electrode 113.

It is to be noted that in the case of the structure which satisfies the aforementioned relation (ii), more preferably, such a structure in which the relation expressed as 0<Lol/Lg≦0.7 hold may be employed. By employing such a structure, it is possible to more suitably suppress parasitic capacity between the gate and the source. Moreover, it is possible to allow the frequency of the turning point to be more securely located on the high frequency side.

Moreover, by employing the structure in which the length Lol of the overlap region satisfies the aforementioned relation (i), it is possible to further effectively suppress parasitic capacity between the gate and the source. Further, it is possible to further suitably suppress reduction in gain.

In addition, as the result of the fact that second insulating film (second insulating film 117) is interposed also between the first field plate electrode 116 (first field plate) side wall and the shielding part 119 of the second field plate electrode 118 (second field plate), additional parasitic capacity is produced. This additional parasitic capacity resulting from the shielding part 119 also contributes to parasitic capacity between the gate and the source. With the view of suppressing contribution of the additional parasitic capacity resulting from the shielding part 119, setting is made such that the height hfp1 of the first field plate electrode 116 (first field plate) side is set at least in the range where it is no higher than the height hg of the gate electrode 113. Namely, it is preferably that, in the structure shown in FIG. 2, the height hfp1 of the side wall of the first field plate electrode 116 (first field plate) is generally selected in the range of hfp1≦0.4 μm.

The shielding part 119 is a portion of the second field plate electrode 118 which is provided between the first field plate electrode 116 and the drain electrode 114 and extends in a normal direction of the substrate 110. The shielding part 119 is provided along the side surface of the first field plate electrode 116, and serves to shield the first field plate electrode 116 from the drain electrode 114. Further, since the upper surface of the shielding part 119 is located above the upper end of the first field plate electrode 116, it is possible to shield, by the shielding part 119, the upper corner part and upper and lower regions thereof of the first field plate electrode 116 in which lines of electric force are apt to concentrate. For this reason, it is possible to suitably suppress occurrence of feedback capacity between the first field plate electrode 116 and the drain electrode 114.

Moreover, the lower end of the first field plate electrode 116 may be located on the nitride semiconductor 111 side relative to the lower end of the shielding part 119. This is the structure in which the thickness of the insulating film lying immediately below respective field plates becomes thick according as the distance from the gate electrode 113 side increases. More specifically, between the gate electrode 113 and the drain electrode 114, the first field plate electrode 116 which is biased at the same electric potential as that of the gate electrode 113 and the second field plate electrode 118 which is biased at the same electric potential as that of the source electrode 112 may be respectively formed in order on the first insulating films 115 and the second insulating films 117. By employing such a structure, the level of effect of the field plates on the drain side is moderated so as to provide an ideal electric field distribution. For this reason, it is possible to further effectively improve breakdown voltage.

Further, the first field plate electrode 116 may be formed integrally continuous with the gate electrode 113, and thus is biased at the same electric potential as that of the gate electrode 113. On the other hand, the second field plate electrode 118 may be biased constantly at a predetermined electric potential, for instance at the same electric potential as that of the source electrode 112. By employing such a structure, it is possible to more reliably reduce capacity between the first field plate electrode 116 and the drain electrode 114. Further, a voltage applied to the second field plate electrode 118 may be dynamically changed.

In the field effect transistor 100, the second field plate electrode 118 is provided between the first field plate electrode 116 and the drain electrode 114, and the second field plate electrode 118 may be electrically connected to the source electrode 112. Moreover, the second field plate electrode 118 is electrically isolated from the first field plate electrode 116 which is biased at the same electric potential as that of the gate electrode 113 with the second insulating film 117 lying therebetween. By employing such a structure, the second field plate electrode 118 can terminate and shield large part of lines of electric force from the drain electrode 114 toward the first field plate electrode 116. For this reason, the feedback capacity component which is produced between the first field plate electrode 116 and the drain electrode 114 can be greatly reduced.

As stated above, by using the structure of this exemplary embodiment, feedback capacity between drain electrode 114 and gate electrode 113 can be greatly reduced, and parasitic capacity between the source electrode 112 and the gate electrode 113 is effectively suppressed. Further, electric field concentration in the vicinity of the gate electrode 113 is greatly relieved. For this reason, compatibility between high gain and high voltage operation can be made, and thus, power performance at a high frequency can be remarkably improved. Moreover, by using SiN film for the first insulating film 115 and the second insulating film 117, the SiN film can suitably function as the surface protective film, which can effectively suppress occurrence of collapse. Accordingly, e.g., also at an operating voltage of 60 V or more, trade-off between collapse and gate breakdown voltage is improved, and feedback capacity between the gate electrode and the drain electrode is reduced. Thus, high frequency field effect transistor with high gain is realized.

Accordingly, in accordance with this exemplary embodiment, it is possible to stably obtain a high frequency/high power field effect transistor which is operable at a high voltage with a high gain.

Moreover, in the present exemplary embodiment, there is employed the structure in which the relation expressed as 0≦Lfd holds, and the first and second field plate electrodes 116 and 118 are respectively provided in a manner in contact with both sides of the second insulating film 117. By employing the structure in which the first and second field plate electrodes 116 and 118 are separated by the insulating film of a single layer (the second insulating film 117), it is possible to further securely shield the first field plate electrode 116 from the drain electrode 114.

Here, in the case where the first field plate electrode 116 and the second field plate electrode 118 are provided at the same horizontal level on the surface of the first insulating film 115, and then an insulating film is provided on the entire upper surface thereof to isolate these field plates, there is a fear that air gap may be formed at the insulating film by unsatisfactory burying between the electrodes. As a result, there is a fear that shielding effect of the first field plate electrode 116 with respect to the gate electrode 113 may be reduced by lowering of dielectric constant at the air gap. In view of the above, in the present exemplary embodiment, after formation of the first field plate electrode 116, the second insulating film 117 is provided from the side surface of the first field plate electrode 116 toward the upper surface of the first insulating film 115, and the second field plate electrode 118 is formed on the second insulating film 117 so that it is suppressed that an air gap is formed at the second insulating film 117. Thus, the second field plate electrode 118 can be stably formed in such a shape suitable to be directly in contact with the second insulating film 117.

Figure 2:
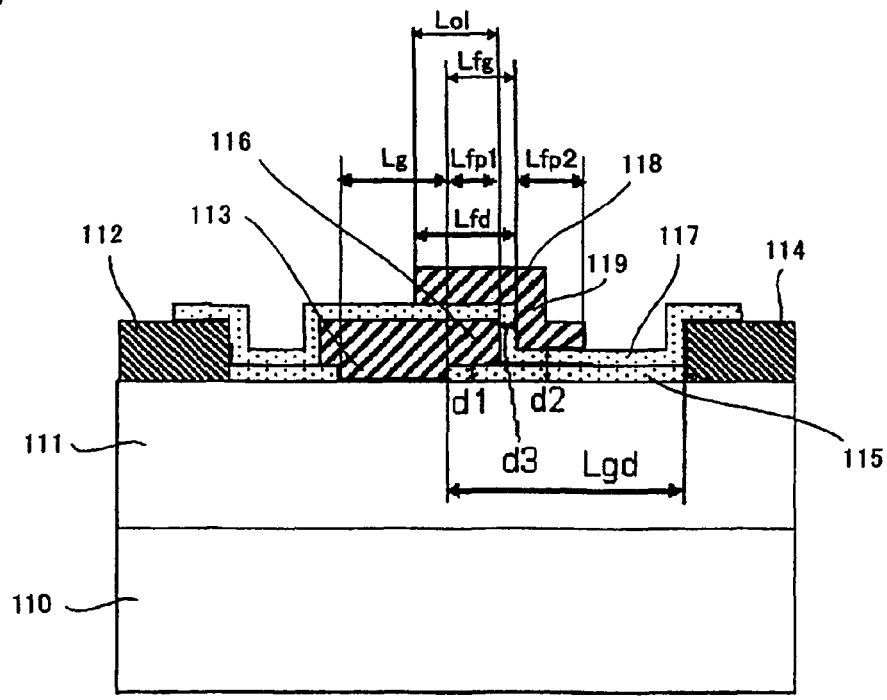
FIG. 2 is a cross sectional view showing the structure of the field effect transistor according to the exemplary embodiment of the present invention, and definition of sizes of respective structural elements thereof.

In the field effect transistor 100, the dimensions of the second field plate electrode 118 can be determined from viewpoints of relief of electric field concentration and reduction of feedback capacity. It is more preferable that such dimensions are determined in a manner as described below in FIG. 2, for example. In FIG. 2 and the following description, meanings of respective marks indicating the length in the cross sectional view in the gate length direction are as follows.

Lg: Gate length,

Lfp1: Length from the drain side end part of the gate electrode 113 up to the drain electrode 114 side end part of the first field plate electrode 116, Lfp2: Length in the gate length direction of the lower surface of the second field plate electrode 118, i.e., length in the gate length direction of the second field plate 118 lower surface from the gate side end part of the shielding part 119 up to the drain side end part of the second field plate electrode 118, Lfd: Cross-section length between the structure comprising the first field plate electrode 116 and the gate electrode 113 and the second field plate electrode 118, where the second insulating film 117 lies therebetween, Lgd: Distance between the gate electrode 113 and the drain electrode 114, Lfg: Cross-section length through the second insulating film 117 between the structure comprising the first field plate electrode 116 and the gate electrode 113, the second insulating film 117, and the second field plate electrode 118, i.e., Lfd=Lol+d3, d1: Distance between the bottom surface of the first field plate electrode 116 and the nitride semiconductor 111, which corresponds to the thickness of the first insulating film 115 in FIG. 2, d2: Distance between the bottom surface (lower surface of the shielding part 119) of the second field plate electrode 118 and the nitride semiconductor 111, which corresponds to sum of the thickness of the first insulating film 115 and the thickness of the second insulating film 117 in FIG. 2, d3: Thickness of the insulating film sandwiched between (side surface of) the first field plate electrode 116 and the second field plate electrode 118, which corresponds to the thickness in the gate length direction of the second insulating film 117 in FIG. 2, and Lol: Length in the gate length direction of the overlap region of the structure comprising the gate electrode 113 and the first field plate electrode 116 and the second field plate electrode 118.

Moreover, the protruded size Lfp1 toward the drain side of the first field plate electrode 116 may be set to, e.g., 0.5 µm. Thus, it is possible to more effectively suppress electric field concentration on the drain side end part of the gate electrode 113. Alternatively, Lfp1 may be 1.5 µm or less. By choosing such a structure, it is possible to more reliably suppress lowering of the high frequency characteristic following increase in the feedback capacity, for example, in such a mode where the second field plate electrode 118 and that of the source electrode 112 are biased at the same electric potential.

Moreover, in regard to the second field plate electrode 118 of the field effect transistor 100, the length Lfp2 in the gate length direction thereof may be set to, e.g., $$0.5 \times Lfp1 \leq Lfp2 \quad (1).$$

By employing such a choice, it is possible to further sufficiently shield lines of electric force between the first field plate electrode 116 and the drain electrode 114.

On the other hand, with the view of improving the breakdown voltage, it is preferable that the end part of the second field plate electrode 118 is spaced by a predetermined distance from the drain electrode 114. In this point, there may be employed a structure in which when the thickness of the insulating film lying between the first field plate electrode 116 and the second field plate electrode 118 is designated as d3, and the distance between the gate electrode 113 and the drain electrode 114 is designated as Lgd, for example, the formula expressed below is satisfied:

$$Lfp1 + Lfp2 + d3 \leq \tfrac{3}{5} \times Lgd \quad (2).$$

By employing such a structure, it is possible to still further improve the gate breakdown voltage. In addition, it is further preferable that there is employed the structure which both satisfies the aforementioned formulas (1) and (2) at the same time.

It is to be noted that, considering breakdown electric field strength ($3\times10^6$ V/cm) and an electric potential difference between the gate electrode and the drain electrode in performing high frequency operation, the distance Lgd between the gate electrode 113 and the drain electrode 114 is required to satisfy at least Lgd$\geq$0.5 µm. On the other hand, in the case where Lgd is unnecessarily long, this results in a cause such that there takes place the aforementioned lowering of power performance resulting from trapping of electrons at the interface states. In view of the above, it is necessary that the distance Lgd between the gate electrode 113 and the drain electrode 114 is set to Lgd$\leq$6 µm at the maximum.

The insulating film lying between the first field plate electrode 116 (first field plate) and the second field plate electrode 118 (second field plate), i.e., the second insulating film (the second insulating film 117) isolates them. In the case where the first field plate electrode 116 (first field plate) is biased at the same electric potential as that of the gate electrode 113, and the second field plate electrode 118 (second field plate) is biased at the same electric potential as that of the source electrode 112, it is necessary to select the thickness d3 of the insulating film so that dielectric breakdown of the second insulating film (second insulating film 117) does not take place at such parts. For example, when the dielectric breakdown strength of the second insulating film (second insulating film 117) is Ebreak2, in the case of a turn-ON voltage of gate being 1V, at least Ebreak2>(1V/d3), i.e., d3>(1V/Ebreak2) is to be satisfied.

On the other hand, with the view of reducing parasitic capacity resulting from a capacitor composed of the first field plate electrode 116 (first field plate), the second field plate electrode 118 (second field plate), and an insulating film lying therebetween, it is preferable that the thickness d3 of the insulating film used for the second insulating film (the second insulating film 117) and the dielectric constant $\in_2$ of the insulating film are selected so that they fall within the range of 0.5 µm$\geq$d3/($\in_2$/$\in_0$)$\geq$0.01 µm.

Moreover, when the thickness of the first insulating film 115 is designated as d1, the distance d2 between the compound semiconductor 111 and the second field plate electrode 118 formed on the insulating film in the region between the first field plate electrode 116 and the drain electrode 114 may be set as to satisfy, for instance, the formula expressed below:

$$d2 \leq 0.5 \times Lfp2 \quad (3)$$

The aforementioned structure can be obtained by adjusting, e.g., the thickness of the first insulating film 115 and the thickness of the second insulating film 117 so that they satisfy the aforementioned formula (3). When such an approach is employed, it is possible to still further sufficiently shield lines of electric force between the first field plate electrode 116 and the drain electrode 114.

In this case, when the distance d2 between the second field plate electrode 118 and the compound semiconductor 111 is set to be, for instance, the sum of the thickness d1 of the first insulating film 115 and the thickness d3 of the second insulating film 117, its lower limit is determined by the lower limit of (d1+d3). On the other hand, in such a structure where the second field plate electrode 118 is formed after the step of recess processing as described later, the thickness d2 of the insulating film is selected in the range such that an electric field formed in the insulating film resulting from a voltage applied to the second field plate electrode 118 (second field plate) is not above a breakdown electric field strength where dielectric breakdown of this insulating film takes place. For example, when the second field plate electrode 118 (second field plate) is biased at the same electric potential as that of the source electrode, in the case where the insulating film is a SiN film, it is necessary to select at least such a condition that the thickness d2 is set within the range of $d2 \geq 1$ nm, as the condition in which the filed is to be not above the breakdown electric field strength.

In the following exemplary embodiments, explanation will be made mainly as to points different from the first exemplary embodiment.

Second Exemplary Embodiment

While explanation has been made in the first exemplary embodiment in connection with the case where there is employed the structure in which the lower surface (lower end) of the first field plate electrode 116 is located on the nitride semiconductor 111 side relative to the lower surface (lower end) of the shielding part 119. In the field effect transistors described in the first embodiment and exemplary embodiments succeeding thereto, there may be employed a structure in which the lower surface (lower end) of the shielding part 119 is located at the lower part relative to the lower surface (lower end) of the first field plate electrode 116, i.e., on the nitride semiconductor 111 side. In this exemplary embodiment, a transistor with such structure will be described.

Figure 11:
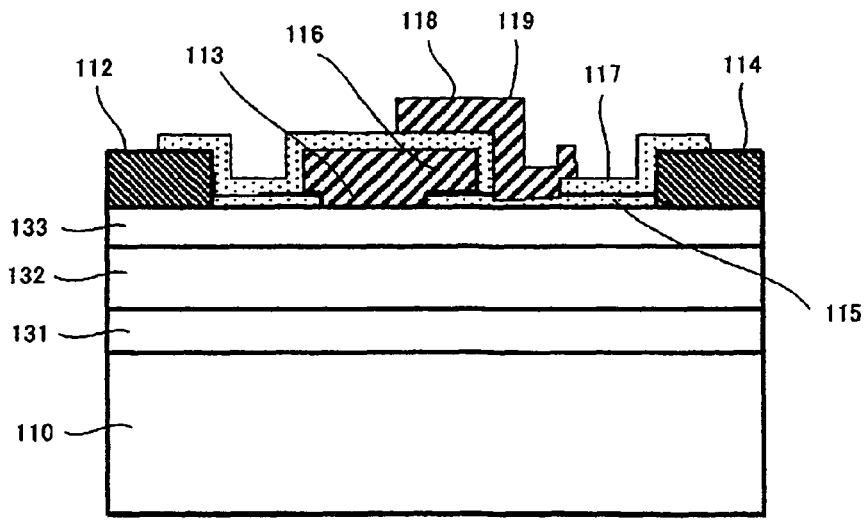
FIG. 11 is a cross sectional view showing the structure of a field effect transistor according to another exemplary embodiment of the present invention.

FIG. 11 is a cross sectional view showing the structure of a field effect transistor of the present exemplary embodiment.

In the field effect transistor shown in FIG. 11, the lower end (lower surface) of the shielding part 119 is located on the nitride semiconductor 111 side relative to the lower end (lower surface) of the first field plate electrode 116. Specifically, the devise comprises the first insulating film 115 for covering the nitride semiconductor 111 surface in the region between the gate electrode 113 and the drain electrode 114, wherein a recessed part (not shown) is provided at the first insulating film 115 in the region between the first field plate electrode 116 and the drain electrode 114, and the first field plate electrode 116 is provided in a manner in contact with a upper surface of the first insulating film 115. Further, the lower end (lower surface) of the shielding part 119 of the second field plate electrode 118 is located within the recessed part, and the lower surface of the second field plate electrode 118 and a part therearound are buried within the recessed part. In other word, in the region where the shielding part 119 is formed, the second insulating film 117 is removed, and the first insulating film 115 is etched off to be thin. Further, the shielding part 119 is in contact with the thinned part.

By making such a modification, there is provided the structure in which the upper part (upper end) of the shielding part 119 is projected over the upper surface of the first field plate electrode 116, and the lower surface (lower end) of the shielding part 119 is projected toward the nitride semiconductor 111 side relative to the lower surface (lower end) of the first field plate electrode 116. For this reason, it is possible to further effectively shield, from the drain electrode 114, the lower corner part as well as the upper corner part and of the first field plate electrode 116 in which lines of electric force are apt to concentrate. Thus, in the integral type structure in which the gate electrode 113 and the first field plate electrode 116 are integrally continuously formed, feedback capacity between the first field plate electrode 116 and the drain electrode 114 is further reduced so to improve high frequency characteristic.

Third Exemplary Embodiment

While explanation has been made in the aforementioned exemplary embodiments in connection with the integral type structure in which the gate electrode 113 and the first field plate electrode 116 are integrally continuously formed, there may be employed a structure in which the gate electrode 113 and the first field plate electrode 116 are structurally separated into different members, and are electrically connected in isolation region (not shown) of the device. The present exemplary embodiment relates to a field effect transistor of such a structure.

Figure 13:
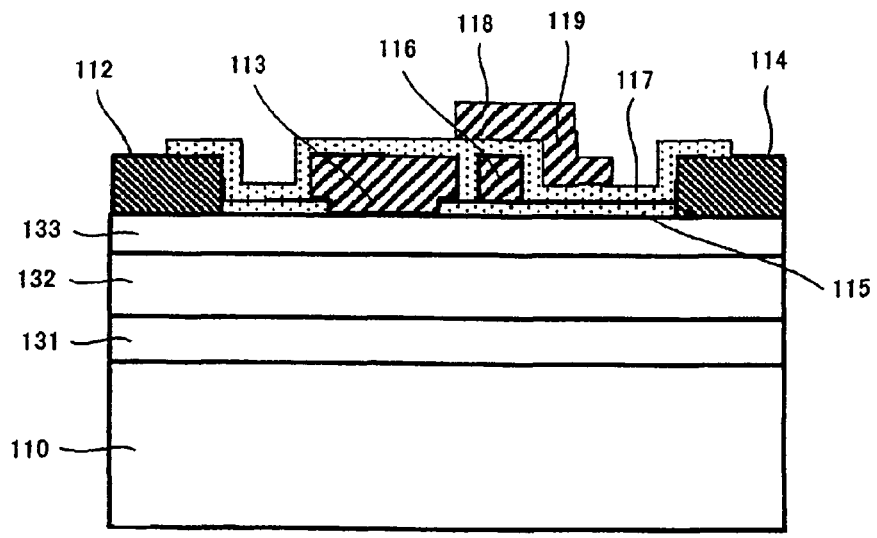
FIG. 13 is a cross sectional view showing the structure of a field effect transistor according to a further exemplary embodiment of the present invention.
Figure 14:
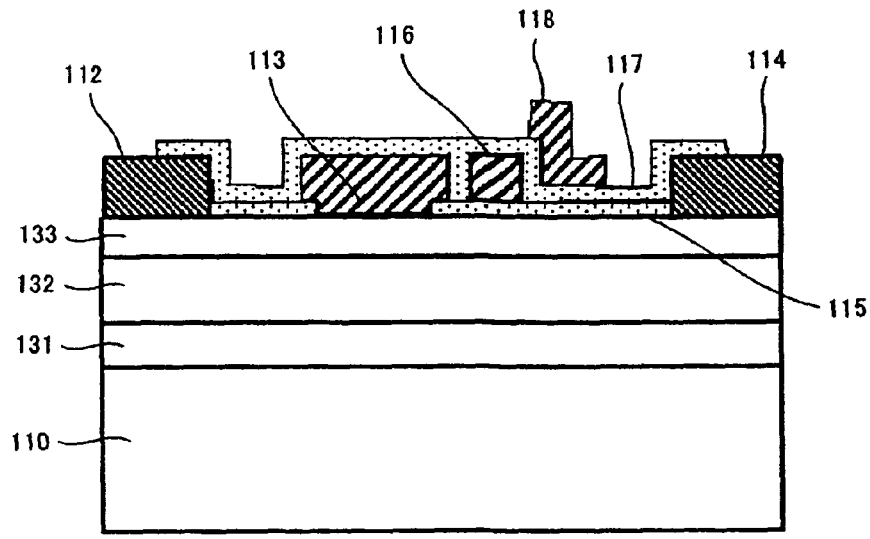
FIG. 14 is a cross sectional view showing one structure of plural types of field effect transistors having difference in parameter Lfd, which were fabricated in Example 7.

FIG. 13 is a cross sectional view showing the structure of the field effect transistor of the present exemplary embodiment. In the field effect transistor shown in FIG. 13, the first field plate electrode 116 serves as an electric field control electrode provided in a manner spaced from the gate electrode 113.

Also in the present exemplary embodiment, similar advantages as that in the first exemplary embodiment can be obtained.

Further, in the field effect transistor shown in FIG. 13, in the cross sectional view in the gate length direction, the first field plate electrode 116 is provided in a manner spaced and isolated from the gate electrode 113. In this structure, differently from the first exemplary embodiment, an electric potential of the first field plate electrode 116 may be controlled independently of the gate electrode 113. The first field plate electrode 116 may be biased at a predetermined electric potential, for instance, is biased at the same electric potential as that of the gate electrode 113. Thus, it is possible to further stably suppress electric concentration onto the drain side end part of the gate electrode 113.

Moreover, since the gate electrode 113 and the first field plate electrode 116 are provided in a separate as different members, it is possible to respectively independently select these materials. For example, a metallic material satisfactory in the Schottky characteristic is selected as the gate electrode 113, and a metallic material with low wiring resistance and satisfactory adhesion with respect to the first insulating film 115 may selected as the first field plate electrode 116. Thus, with the view of achieving high gain and high voltage operation, the device with such a structure may provide such advantage that further more excellent high frequency/high output performance than those of the first exemplary embodiment are achieved.

Figure 15:
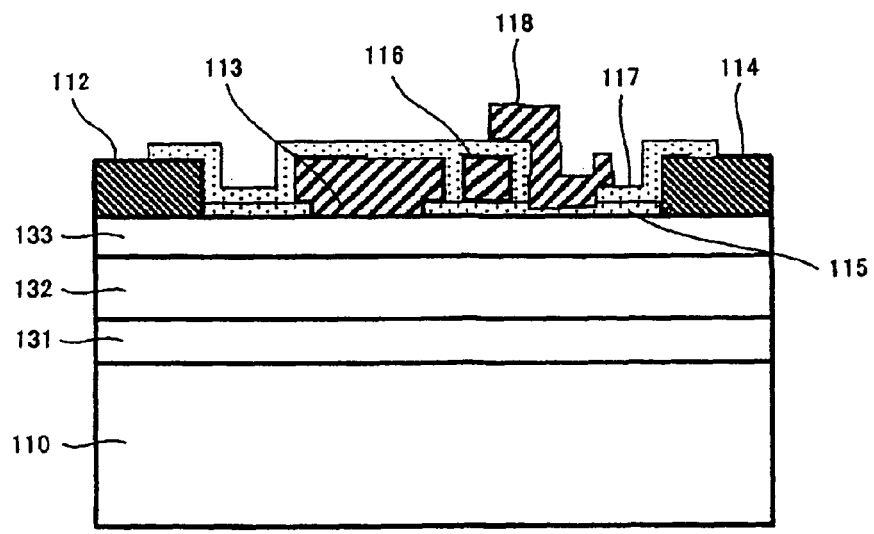
FIG. 15 is a cross sectional view showing the structure of a field effect transistor according to a still further exemplary embodiment of the present invention.
Figure 16:
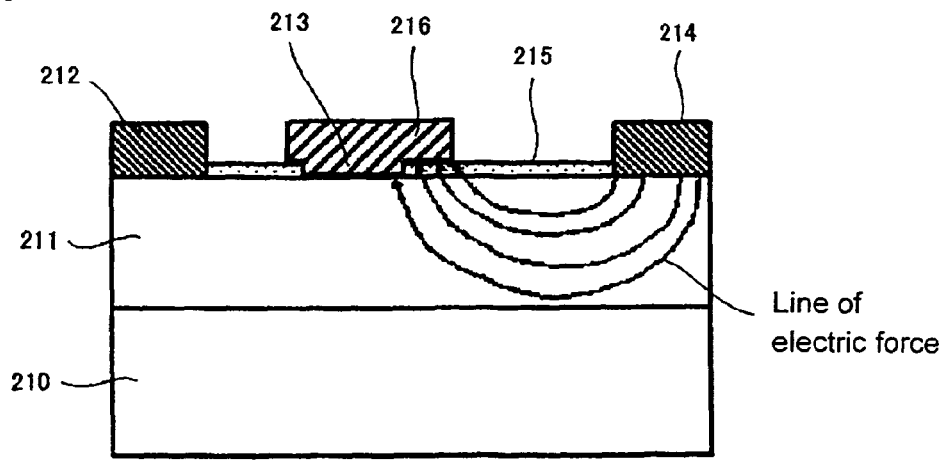
FIG. 16 is a cross sectional view schematically showing the structure of a conventional type of field effect transistor comprising one field plate electrode, and lines of electric force reflecting electric field distribution in the gate-drain region.
Figure 17:
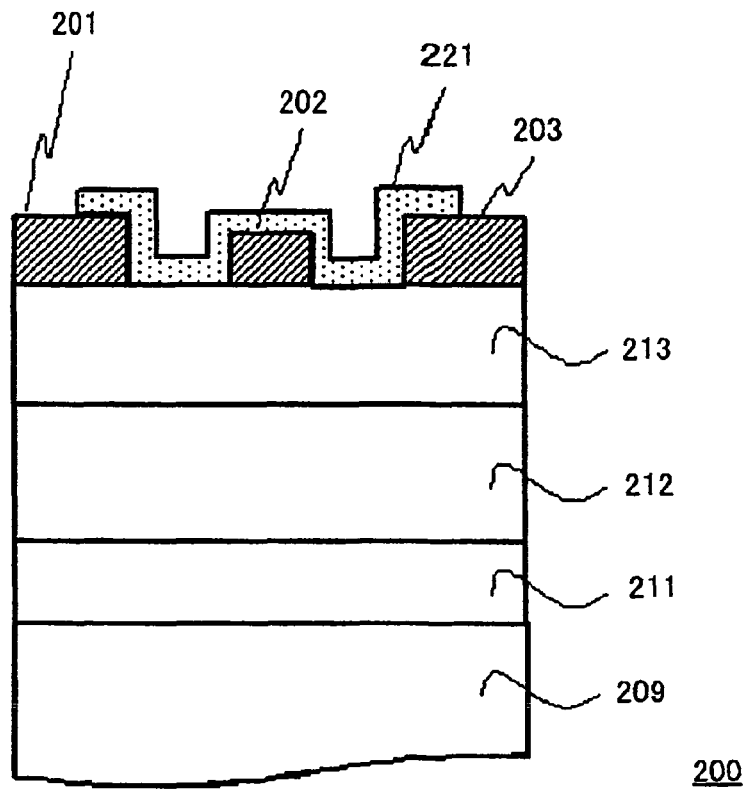
FIG. 17 is a sectional view schematically showing the structure of a conventional type of field effect transistor comprising no field plate electrode.
Figure 18:
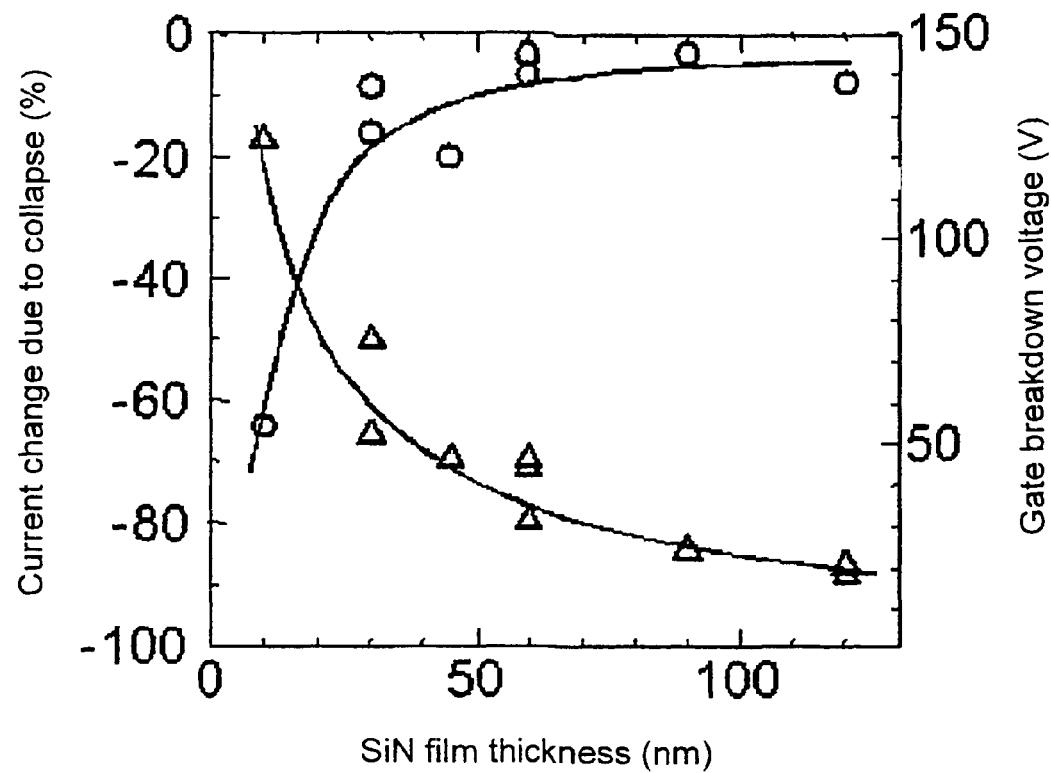
FIG. 18 is a chart showing the relationship between SiN film thickness of the uppermost layer, and current change by collapse and gate breakdown voltage, which has been evaluated in the conventional type of field effect transistor with the structure shown in FIG. 17.

It is to be noted that also in the case where the device according to this exemplary embodiment comprises the first field plate electrode 116 being provided in a manner spaced from the gate electrode 113, as disclosed below in Examples, there may be employed a structure in which, in the region where the shielding part 119 is to be formed, the second insulating film 117 is removed, and a portion of the first insulating film 115 is removed by etching, and thereby the lower surface (lower end) of the second field plate electrode 118 is located on the lower side (nitride semiconductor 111 side) relative to the lower surface (lower end) of the first field plate electrode 116. in a quite similar manner to the second exemplary embodiment. FIG. 15 is a cross sectional view showing the structure of such a transistor.

While there will be shown specific cases of the structures where electrons are used as carriers for operation of the FET in the following Examples, it is a matter of course that. shielding effect by the second field plate can be obtained entirely in the same manner also in the structure using holes as carriers.

EXAMPLES

The structures of the aforementioned exemplary embodiments will now be explained in more detail by using specific examples. The Examples 1 to 5 correspond to the first or second exemplary embodiment, and the Examples 6 to 10 correspond to the second or third exemplary embodiment.

Example 1

Figure 3:
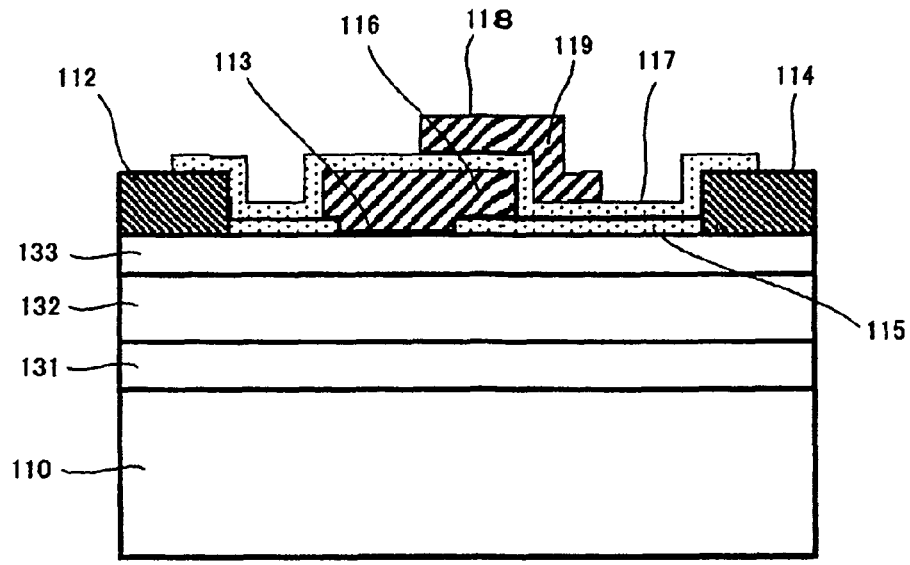
FIG. 3 is a cross sectional view showing the structure of a field effect transistor of an example.

In the present example, the field effect transistor shown in FIG. 3 was fabricated and was compared to a conventional type of transistor. FIG. 3 is a cross sectional view showing the structure of the field effect transistor of this example. In the field effect transistor shown in FIG. 3, as the semiconductor substrate 110, a high resistance SiC substrate was used.

As layers corresponding to the nitride semiconductor 111, an AlN buffer layer 131 of 4 nm, a GaN layer 132 of 2000 nm, and an AlGaN layer 133 (Al composition ratio 0.25, thickness 30 nm) were formed in order recited on the substrate 110. Next, Ti, Al were deposited in order recited, and then lift-off process was used to form the source electrode 112 and the drain electrode 114. Further, heat treatment was performed at 650° C. under nitrogen atmosphere to thereby form ohmic-contact between these electrodes and the AlGaN layer 133.

Thereafter, a SiN film with the film thickness of 100 nm was formed as the first insulating film 115, for instance, by means of plasma CVD method, between the source electrode 112 and the drain electrode 114. Further, a region where the gate electrode 113 was to be formed was opened by dry etching to form an opening part at the first insulating film 115.

Subsequently, Ni and Au were deposited in order recited in a predetermined region on the first insulating film 115 to fill the opening part, and then an integral type electrode of the gate electrode 113 and the first field plate electrode 116 was formed by the lift-off process. The gate length Lg of the gate electrode 113 was set to 0.5 μm, and Lfp1 of the first field plate electrode 116 was set to 0.5 μm.

Further, a SiN film with the film thickness of 150 nm was formed as the second insulating film 117 in the region from the upper part of the second electrode 112 toward the upper part of the drain electrode 144. Further, the second field plate electrode 118 was formed in a manner in contact with the upper surface of the second insulating film 117. Ti, Pt and Au electrode for the second field plate electrode were deposited in order, and then lift-off process was carried out to form the second field plate electrode 118 in a predetermined region on the second insulating film 117. In the second field plate electrode 118, Lfd and Lfp2 were respectively set to 0.4 μm and 1.0 μm.

In the subsequent step of wiring, the second field plate electrode 118 and the source electrode 112 were electrically connected in the isolation region (not shown in FIG. 3).

Figure 19:
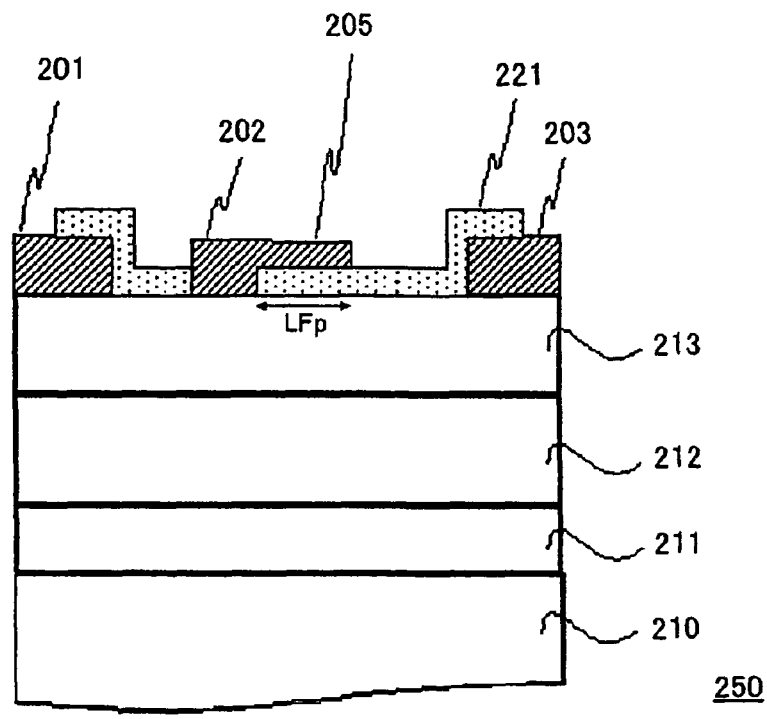
FIG. 19 is a cross sectional view schematically showing the structure of a conventional type of field effect transistor comprising a field plate electrode formed in a shape of the type integral with a gate electrode.
Figure 20:
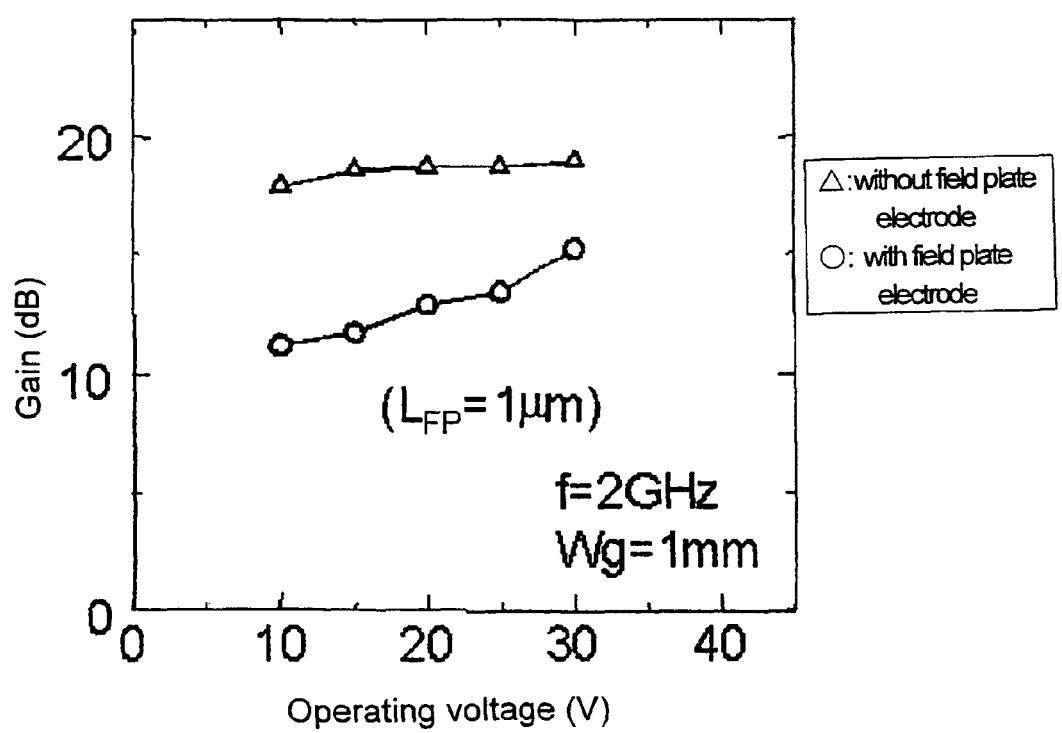
FIG. 20 is a chart showing the relationship between operating voltage and gain in two conventional types of field effect transistors which respectively comprise a field plate electrode formed in a shape of the type integral with a gate electrode, and does not comprises such a field plate electrode.
Figure 21:
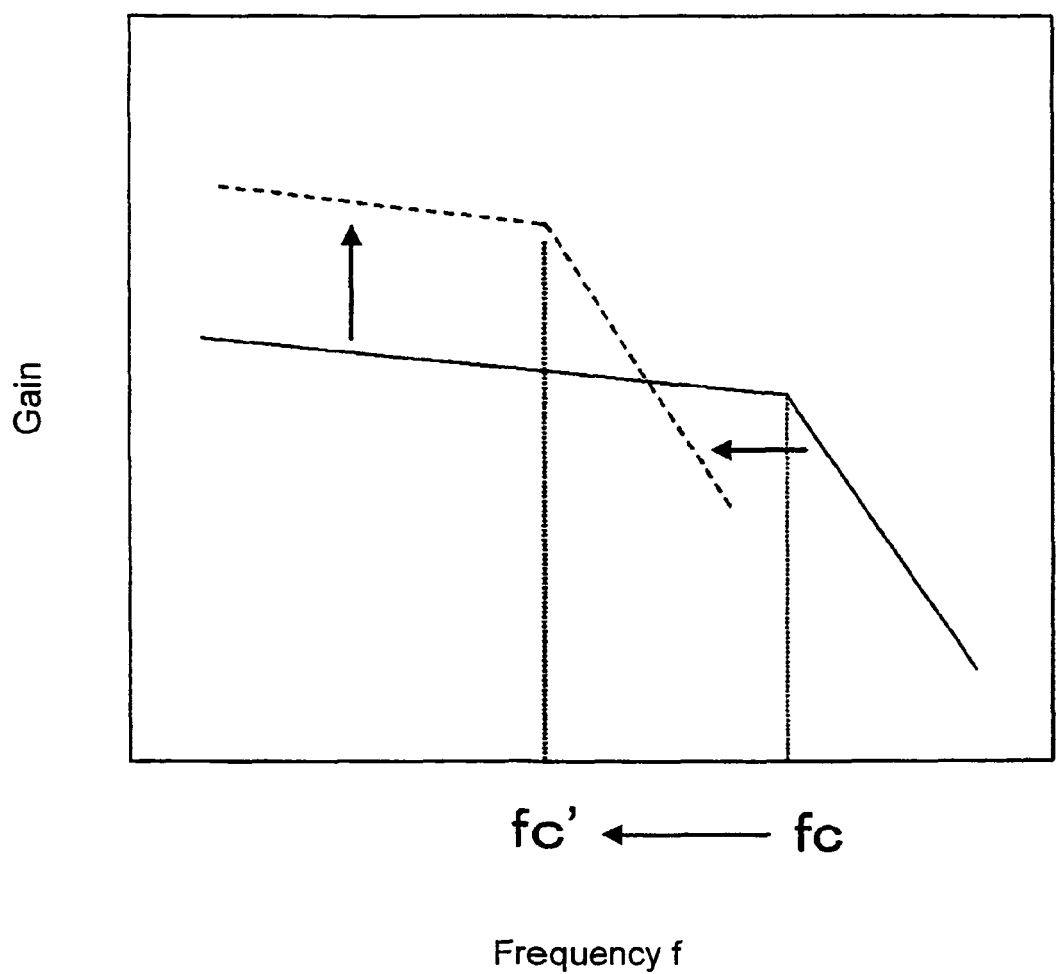
FIG. 21 is a chart schematically showing change of the relationship between frequency and gain of a conventional type of field effect transistor in providing a second field plate electrode in addition to a first field plate electrode formed in a shape integral with a gate electrode.

In addition, for the purpose of comparing the effect of the structure used for the transistor of this example to the conventional type of structure, a field effect transistor (shown in FIG. 19) comprising no second field plate electrode 118 was fabricated as a field effect transistor with a field plate of the conventional structure type.

Figure 4:
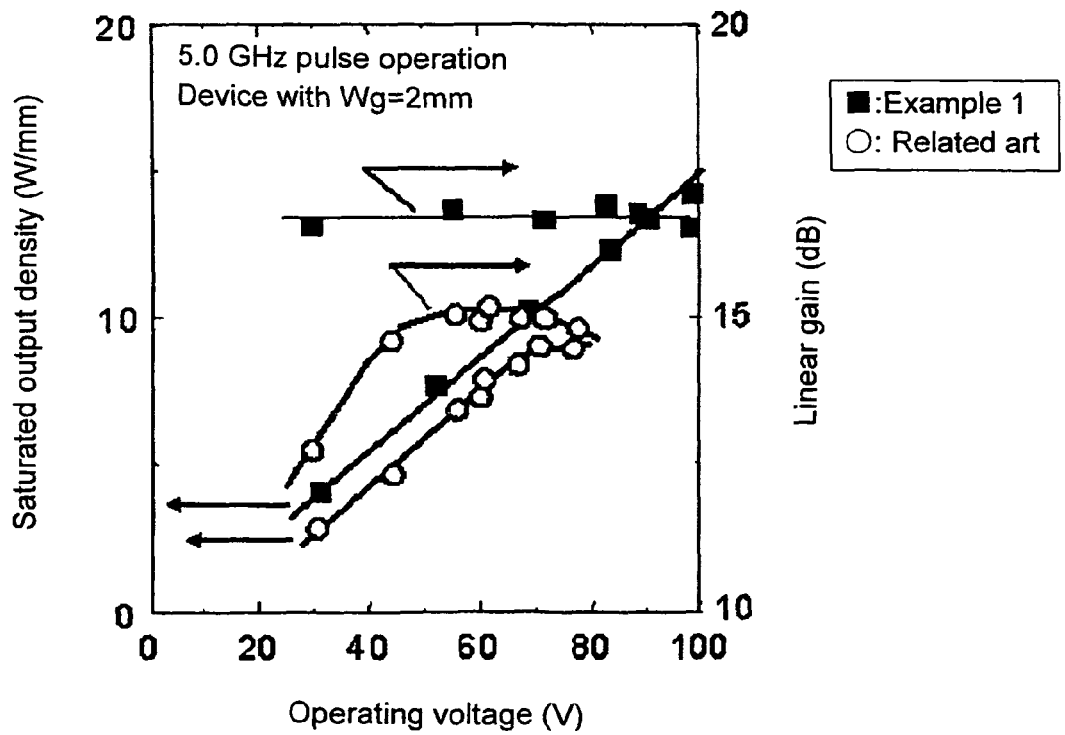
FIG. 4 is a chart showing the evaluated relationship between operating voltage and power performance (saturated output density, linear gain) in the field effect transistor of Example 1.

FIG. 4 is a chart showing the results of the power performance evaluated for the transistor of this example and the conventional type of transistor at an operating frequency of 5 GHz. In the present example, the influence of heat produced in the transistor was suppressed to perform comparison in a pulse operation of an elemental device with a gate width of 2 mm in order to clarify the effect of the structure of the present example.

As shown in FIG. 4, in the conventional type of transistor (shown in FIG. 19), a sufficient gain cannot be provided because of feedback capacity due to the field plate part 205 at a relatively lower operating voltage, and gain was about 15 dB also at an operating voltage of 40 V or more. Moreover, also with respect to output density, current collapse was observed at an opening voltage of 60V or more. Therefore, there was a tendency such that a saturated output was saturated at a value of 10 W/mm.

On the contrary, in the transistor of the present example, since the feedback capacity between the gate electrode and the drain electrode was reduced, a high gain of about 17B was obtained from a low operating voltage. Further, since the first field plate electrode 116 and the second field plate electrode 118 were adjacent with use of the second insulating film 117 as a spacer, its moderation effect of electric field concentration was high. As a result, current collapse was not observed up to 100 V operation. Thus, a saturated output density of 15 W/mm was realized.

Figure 5:
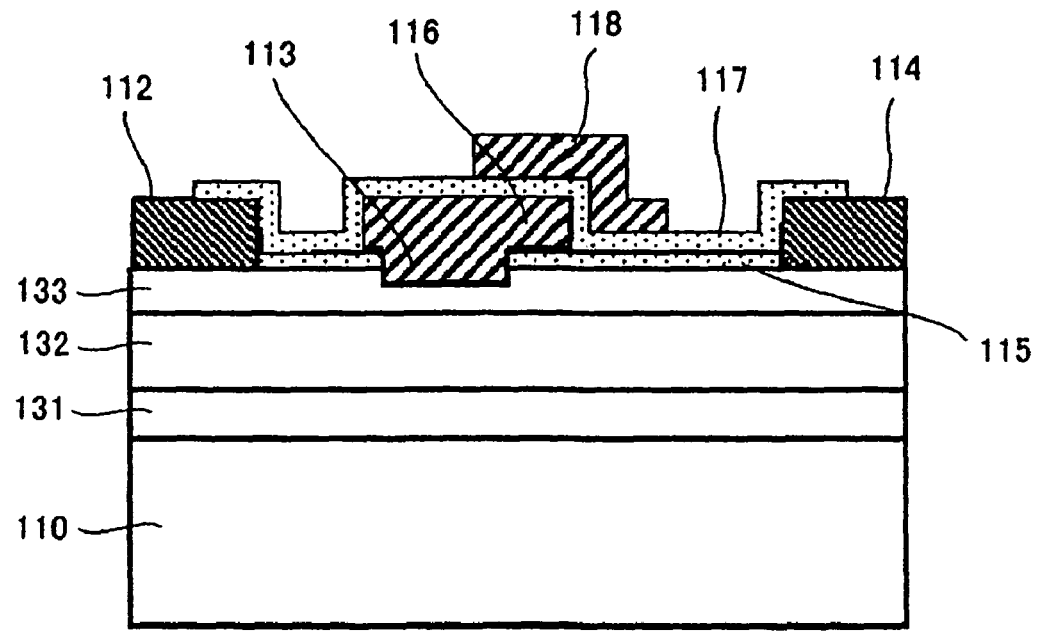
FIG. 5 is a cross sectional view showing the structure of a field effect transistor employing wide recess structure according to Example.

While the transistor where the gate electrode 113 was formed without recess-etching the AlGaN layer 133 was used as an example in the aforementioned example, the AlGaN layer 133 may be recess-etched before deposition of Ni and Au thereafter to form gate electrode 113. In this case, the structure shown in FIG. 5 is obtained. FIG. 5 is a cross sectional view showing another structure of the field effect transistor of this example. The structure of FIG. 5 is a so-called gate recess structure (hereinafter referred to as recess gate structure as occasion may demand). In FIG. 5, the AlGaN layer 133 is provided between the GaN layer 132 and the source and drain electrodes 112 and 114, and a recessed part is provided at the AlGaN layer 133 in the region between the source electrode 112 and the drain electrode 114. Further, a portion of the lower part of the gate electrode 113 is buried within the recessed part of the AlGaN layer 133, and the source electrode 112 and the drain electrode are provided in a manner in contact with the upper surface of the AlGaN layer 133. By this structure, further excellent gate breakdown voltage can be obtained by the effect of the first field plate electrode 116 in combination.

As the result of the fact that similar evaluation was performed by using the field effect transistor shown in FIG. 5, a transistor performance with higher gain was obtained.

Next, the relationship between frequency and gain was examined for the transistor used in the evaluation of FIG. 4. In particular, in the transistors shown in FIGS. 3 and 19, setting was made such that at operating voltage of 50 V, power supply voltage Vdd=50 V, gate width Wg=2 mm, gate length Lg=0.5 µm, Lfp1=0.5 µm, and d3=150 nm, and with variety of Lfd=0 µm, 0.2 µm, 0.5 µm, 0.7 µm, 1.0 µm, and 1.5 µm to examine turning points where gain was abruptly lowered.

Figure 22:
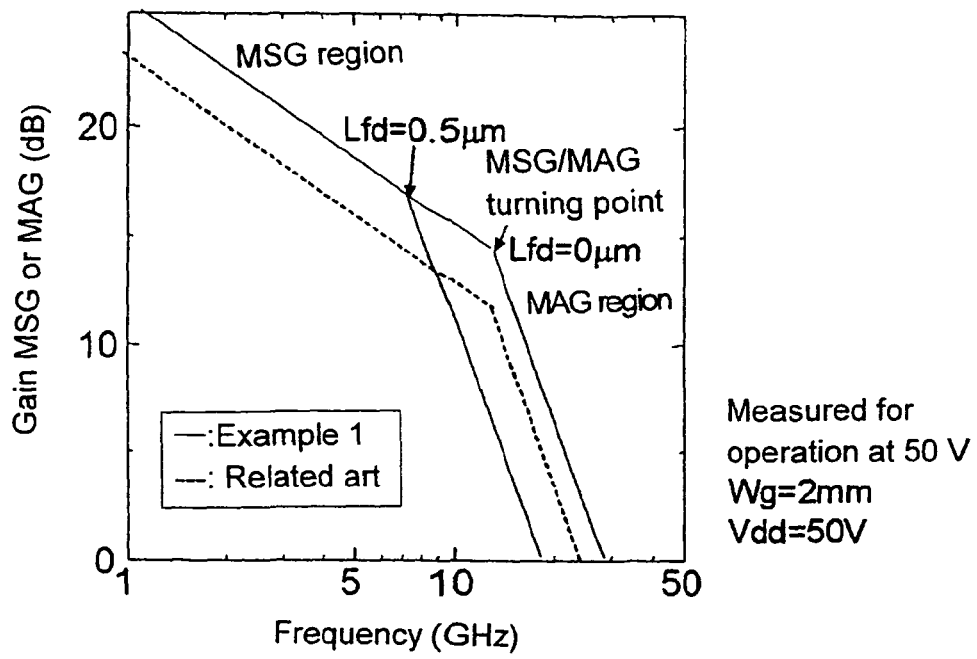
FIG. 22 is a chart showing the relationship between frequency and gain in the field effect transistor described in Example 1 with the structure shown in FIG. 3.

FIGS. 22(*a*) and 22(*b*) are charts showing measurement result of the turning point. FIG. 22(*a*) is a chart showing the relationship between frequency (GHz) and MSG (Maximum stable power gain) (dB) or MAG (Maximum available power gain) (dB). FIG. 22(*b*) is a chart showing the relationship between Lfd=d3+Lol (µm) and turning points (GHz) measured for the transistor shown in FIG. 3.

From FIGS. 22(*a*) and 22(*b*), it was possible to improve gain by using the structure shown in FIG. 3 with respect to the conventional type of transistor (shown in FIG. 19) comprising one field plate which was formed in a type integral with the gate electrode. Further, it is found that when the relation expressed as $0 \leq Lfd \leq 0.5$ µm is set in the structure with gate length Lg=0.5 µm, the turning point can be maintained at 100 GHz or more. It was understood that operation can be performed on the low frequency side relative to the turning point, and thus it is possible to stably obtain a high gain, for example, in such a high frequency region of 5 GHz or more.

Moreover, it has been found out that with a structure in which the relations expressed as $0 \leq Lfd \leq 0.5$ µm, Lg=0.5 µm and d3=150 nm are set, whereby, in connection with the length Lol in the gate length direction of the overlap region of the first field plate electrode 116 and the gate electrode 113 and the second field plate electrode 118, the relations expressed below are satisfied:

$$Lol/Lg=(Lfd-d3)/Lg, \text{ and}$$

$$0 \leq Lol/Lg \leq 1,$$

it is possible to suitably maintain the turning point on the high frequency side.

It is to be noted that Ti, Pt and Au were used as metals serving as materials of the second field plate electrode 118 in the present example, but any conductive material which does not peel on the insulating film may be used as the material of the second field plate electrode 118 in this example and other examples disclosed below without any further limitation. Such other materials used for the second field plate electrode 118 include, for instance, a single layer, or a multilayer structure of films made of a conductive material such as TiN, WSi, WN, Mo, Al or Cu.

Moreover, while the SiC substrate was used as the substrate 110 in the present example, other substrates on which nitride semiconductor crystal can be formed, such as sapphire substrate or Si substrate may used in this example and other examples disclosed below, as described in the first exemplary embodiment.

While the case of the nitride semiconductor transistor used in 5 GHz band is taken as example in the present example, if manufacturing is performed with such a restriction that gate length Lg=0.7-1.0 µm is chosen as a center of range thereof for a transistor used in 2 GHz band, and gate length Lg=0.10-0.25 µm is chosen as center of range thereof for a transistor used in the sub-millimeter-wave band, similar effects can be provided for a transistor used in other frequency band in the present example and the examples described below. Namely, by employing a structure such that respective sizes satisfy the aforementioned relations, it is possible to obtain a transistor being further excellent in high voltage/high frequency characteristic.

In the following examples, explanation will be made mainly as to points different from Example 1.

Example 2

In the present example, the influence on the shielding effect of the Lfd: cross-section length between the structure composed of the first field plate electrode 116 and the gate electrode 113 and the second insulating film 117, and the second field plate electrode 118 through the second insulating film 117 was examined for the field effect transistor shown in FIG. 3. The respective constituent members thereof are as follows. In this specification, description is made such that the layer structure is "lower layer/(intermediate layer/) upper layer" in order from the lower layer side (the side close to the substrate 110).

Substrate 110: high resistance SiC substrate

Layers corresponding to the nitride semiconductor 111: AlN buffer layer 131 (thickness 4 nm), GaN layer 132 (thickness 2000 nm), AlGaN layer 133 (Al composition ratio 0.25, thickness 30 nm)

First insulating film 115: SiN film with film thickness of 100 nm

Source Electrode 112, drain electrode 114: Ti/Al electrode

Gate electrode 113: gate length Lg=0.5 µm

First field plate electrode 116: Ni/Au electrode with Lfp1=0.5 µm, being formed in the integral type electrode with the gate electrode 113

Second insulating film 117: SiN film, with film thickness of 150 nm

Second field plate electrode 118: Ti/Pt/Au electrode with Lfp2=1.0 µm

Lfd=−0.5 µm, −0.25 µm, +0.25 µm, +0.5 µm, +0.75 µm, +1.0 µm

Figure 6:
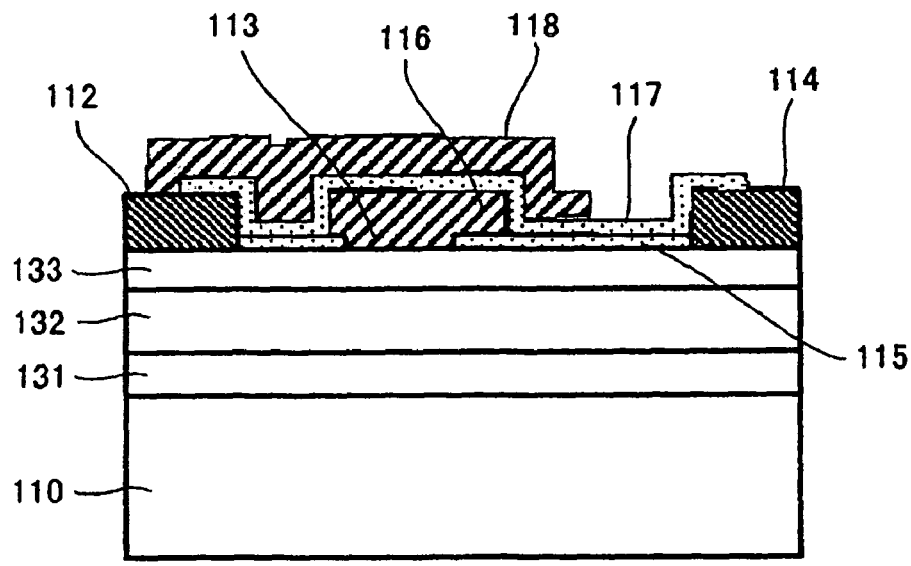
FIG. 6 is a cross sectional view showing one structure of plural types of field effect transistors having difference in parameter Lfd, which were fabricated in Example 2.
Figure 8:
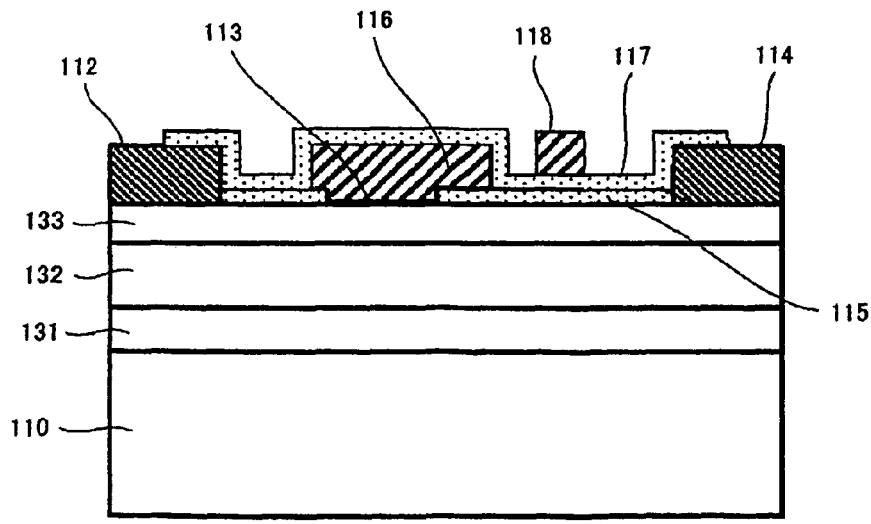
FIG. 8 is a cross sectional view showing one structure of plural types of electric field transistors having difference in parameter Lfd, which were fabricated in Example 2.

As stated above, devices different in cross-section length Lfd were fabricated. In this case, in the case of Lfd=0, the side surfaces of the second insulating film 117 and the second field plate 118 are in contact with each other. In the case of Lfd<0, they are spaced to each other (as shown in FIG. 8). In addition, there was fabricated such a field effect transistor (shown in FIG. 6) in which the second field plate electrode 118 and the source electrode 112 were electrically connected in the operation layer region, in the step of wiring. In the field effect transistor shown in FIG. 6, the effective distance Lsd between the source and the drain was set to 1.0 µm, and Lfd was set to 1.5 µm.

Figure 7:
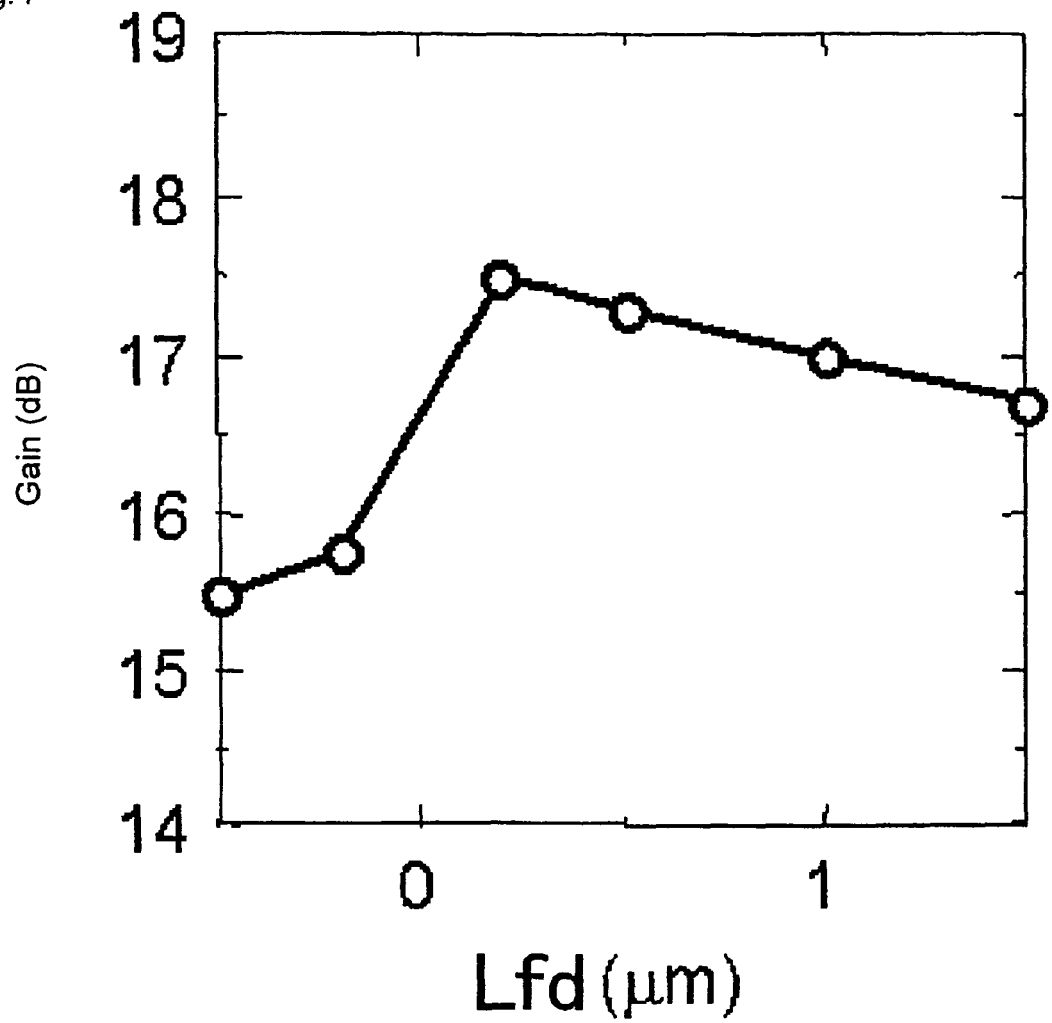
FIG. 7 is a chart showing the relationship between parameter Lfd and gain of transistor evaluated by using plural types of field effect transistors having difference in parameter Lfd, which were fabricated in Example 2.

The Lfd dependency of linear gain obtained by evaluation results of power performance at the operating frequency 5 GHz was evaluated with respect to the obtained transistor (shown in FIG. 3). FIG. 7 is a chart showing the results evaluated.

The gain was about 15 dB (as shown in FIG. 4) also at an operating voltage of 40 V or more in the conventional type of transistor, whereas it is understood from FIG. 7 that the gain is improved in the transistor of this example, and when Lfd is positive value (Lfd$\geq$0), the gain is further remarkably improved as compared to the case of negative value (as shown in FIG. 8). It is considered that when the relation expressed as Lfd$\geq$0 holds, that shielding effect of the second field plate electrode 118 is much larger, and thus the feedback capacity between the gate electrode and the drain electrode can be further stably reduced. On the other hand, in the transistor of the structure shown in FIG. 6, sufficient gain could not be obtained.

Example 3

Figure 9:
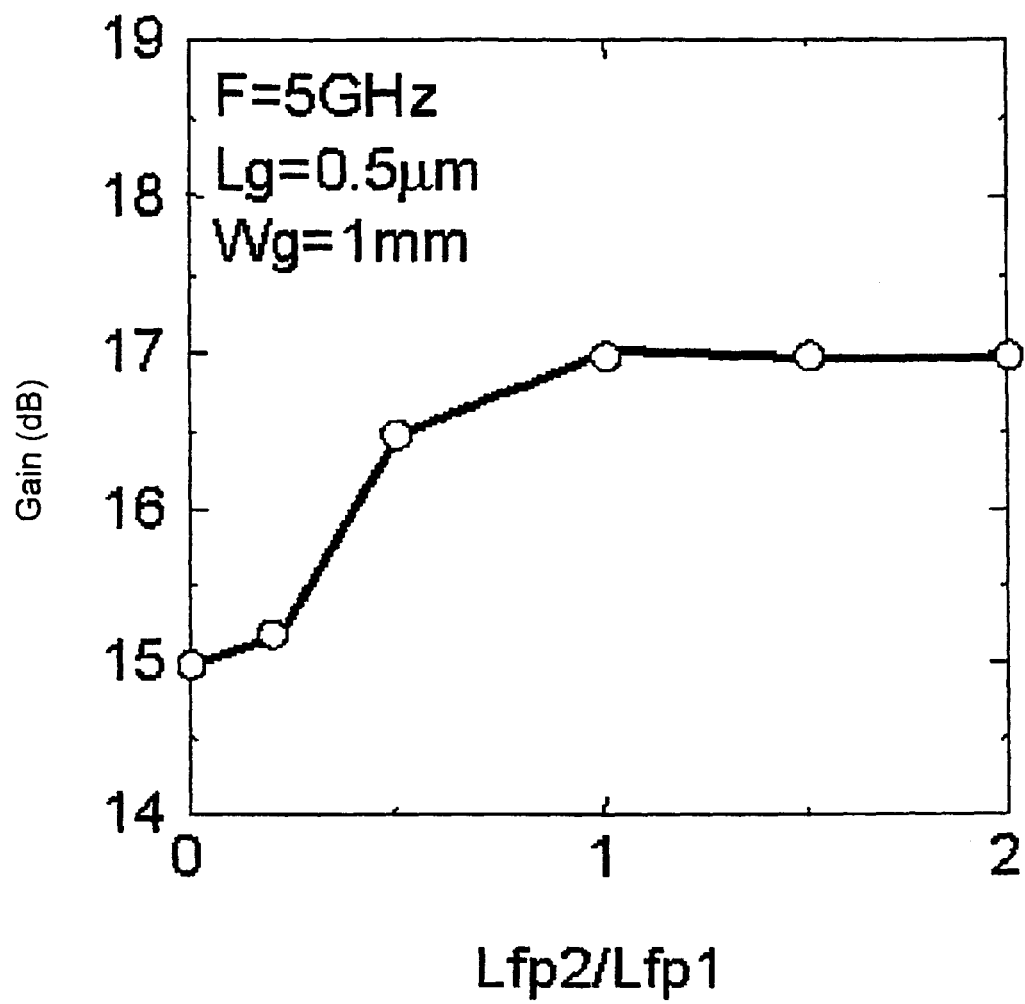
FIG. 9 is a chart showing the relationship between parameters Lfp1, Lfp2 and gain of the transistor evaluated by using plural types of field effect transistors having difference in parameter Lfp2, which were fabricated in Example 3.

In the present example, the relationship between the length Lfp1 of the first field plate electrode 116 and the length Lfp2 of the second field plate electrode 118 was examined for the field effect transistor shown in FIG. 3. The respective constituent members thereof are as follows:

Substrate 110: high resistance SiC substrate
Layers corresponding to the nitride semiconductor 111: AlN buffer layer 131 (thickness 4 nm), GaN layer: 132 (thickness 2000 nm), AlGaN layer 133 (Al composition ratio 0.25, thickness 30 nm)
First insulating film 115: SiN film with film thickness of 100 nm
Source Electrode 112, drain electrode 114: Ti/Al electrode
Gate electrode 113: gate length Lg=0.5 µm
First field plate electrode 116: Ni/Au electrode with Lfp1=0.5 µm, being formed in the integral type electrode with the gate electrode 113
Second insulating film 117: SiN film with film thickness of 200 nm (d3=0.2 µm)
Second field plate electrode 118: Ti/Pt/Au electrode with Lfd=+0.75 µm
Lfp2=0 µm, 0.1 µm, 0.25 µm, 0.5 µm, 0.75 µm, 1 µm With respect to the obtained transistor (shown in FIG. 3), the Lfp2 dependency of linear gain obtained by the evaluation results of power performance at an operating frequency 5 Ghz was evaluated. FIG. 9 is a chart showing the results evaluated.

From FIG. 9, in the transistor of this example, the gain was improved. In particular, in the structure in which, in regard to the ratio between the length Lfp1 of the first field plate electrode 116 and the length Lfp2 of the second field plate electrode 118, 0.5≦Lfp2/Lfp1, i.e., the aforementioned formula (1) is satisfied, shielding effect by shielding of lines of electric force which is caused by use of the second field plate electrode 118 is high, and thus feedback capacity between the gate electrode and the drain electrode is reduced so that remarkable improvement in gain is achieved.

Example 4

In the present example, the maximum value of the length Lfp2 of the second field plate electrode 118 was examined for the field effect transistor shown in FIG. 3. The respective constituent members thereof are as follows:

Substrate 110: high resistance SiC substrate
Layers corresponding to the nitride semiconductor 111: AlN buffer layer 131 (thickness 4 nm), GaN layer 132 (thickness 2000 nm), AlGaN layer 133 (Al composition ratio 0.25, thickness 30 nm)
First insulating film 115: SiN film with film thickness of 100 nm
Source Electrode 112, drain electrode 114: Ti/Al electrode
Gate electrode 113: gate length Lg=0.5 µm
First field plate electrode 116: Ni/Au electrode with Lfp1=0.3 µm, being formed in the integral type electrode with the gate electrode 113
Second insulating film 117: SiN film with film thickness of 200 nm (d3=0.2 µm)
Second field plate electrode 118: Ti/Pt/Au electrode with Lfd=+0.75 µm
Lfp2=0 µm, 0.3 µm, 0.9 µm, 1.7 µm, and 2.3 µm
Lgd=3.5 µm Moreover, for comparison, there was fabricated a transistor in which Lfp1=0 µm and Lfp2=0 µm.

Figure 10:
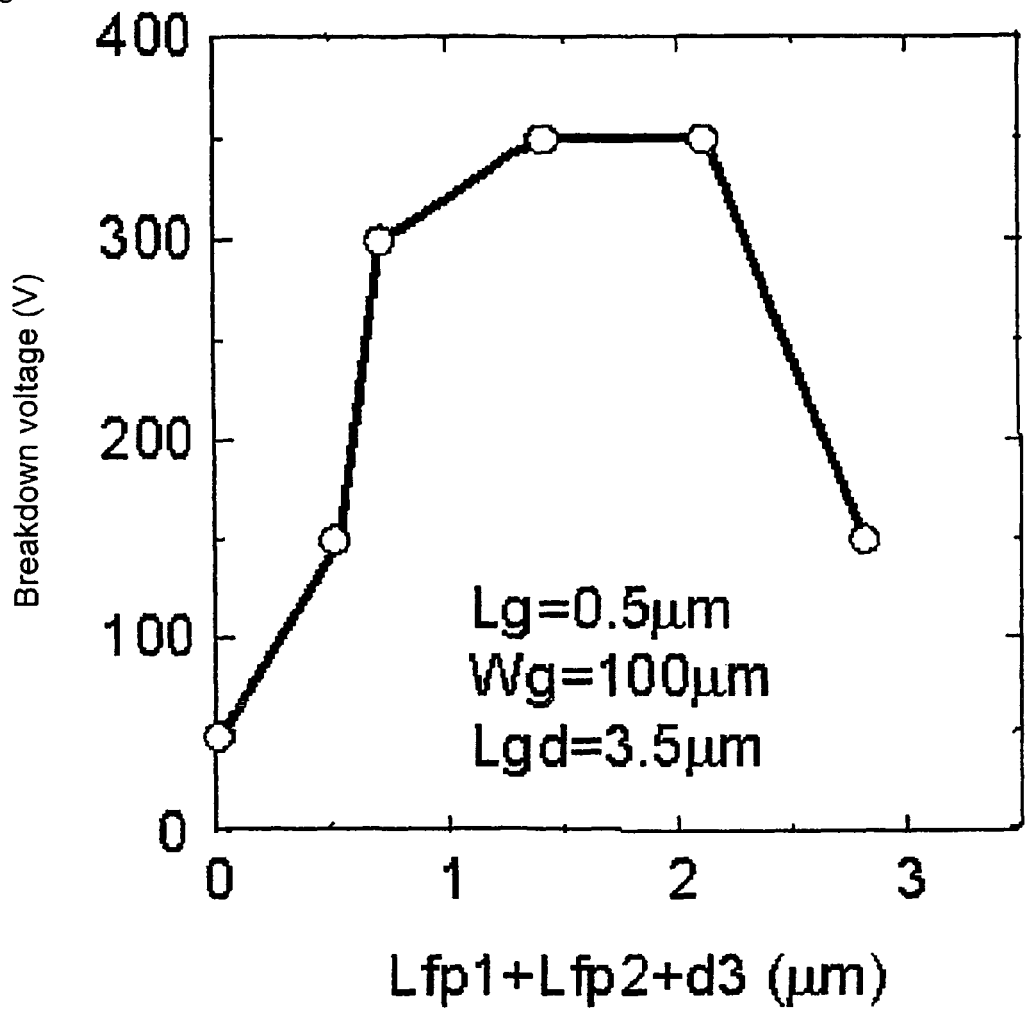
FIG. 10 is a chart showing the relationship between parameters Lfp1, Lfp2, d3 and breakdown voltage of the transistor evaluated by using plural types of field effect transistors having difference in parameter Lfp2 is different, fabricated in the example 4.

FIG. 10 is a chart showing evaluation results of breakdown voltage measured for the obtained transistor. From FIG. 10, when, in the case where the length Lfp1 of the first field plate electrode 116 was 0.3 µm and the thickness d3 of the second insulating film 117 on the side surface of the first field plate electrode 116 was 0.2 µm, the length Lfp2 of the second field plate electrode 118 increased from 0 up to 0.3 µm, and thus Lfp1+Lfp2+d3 increased up to 0.8 µm, the breakdown voltage was remarkably improved so that it became as high as 300 V. Moreover, when Lfp2 increased to 2.3 µm so that Lfp1+Lfp2+d3 became equal to 2.8 µm, the breakdown voltage is abruptly lowered down to 150 V. It is considered that when Lfp1+Lfp2+d3 was larger than ⅗×Lgr with respect to Lgr (=3.5 µm), electric field concentration of the drain end of the second field plate electrode 118 became large so that the breakdown voltage was lowered. Accordingly, with use of a structure which satisfies:

$$Lfp1+Lfp2+d3 \leq \tfrac{3}{5} \times Lgr, \qquad (2)$$

it is possible to further improve the breakdown voltage.

It is to be noted that while the transistor in which the gate electrode 113 was formed without recess-etching the AlGaN layer 133 was used in the aforementioned example, the AlgaN layer 133 may be recess-etqhed before deposition of Ni/Au, and the gate electrode 113 may be then formed (shown in FIG. 5). In such a case, a transistor performance with higher gain can be attained.

Example 5

In the present example, in the field effect transistor shown in FIG. 3, the length Lfp2 of the second field plate electrode 118 and the thickness d2 of the second insulating film 117 were examined. The respective constituent members thereof are as follows:

Substrate 110: high resistance SiC substrate
Layers corresponding to the nitride semiconductor 111: AlN buffer layer 131 (thickness 4 nm), GaN layer 132 (thickness 2000 nm), AlGaN layer 133 (Al composition ratio 0.25, thickness 30 nm)
First insulating film 115: SiN film with film thickness of 100 nm
Source electrode 112, drain electrode 114: each Ti/Al electrode
Gate electrode 113: gate length Lg=0.5 µm
First field plate electrode 116: Ni/Au electrode with Lfp1=0.5 µm, being formed in the integral type electrode with the gate electrode 113
Second insulating film 117: $SiO_2$ film with variety of film thicknesses of 0.1 µm, 0.3 µm, 0.5 µm and 0.7 µm
Second field plate electrode 118: Ti/Pt/Au electrode with Lfp2=1.0 µm Moreover, there was fabricated a device in which a portion of a device where the thickness of the $SiO_2$ film of the second insulating film 117 was set to 0.1 µm was divided to remove the $SiO_2$ film by etching. Further, there was also fabricated a sample in which the thickness of the $SiO_2$ film of the second insulating film 117 was set to 0.1 µm, and from the thickness of 100 nm of the first insulating film 115, a part with 50 nm thickness is removed by etching, and then on the upper layer thereof, a Ti/Pt/Au electrode with Lfp2=1.0 µm was formed as the second field plate electrode 118 by deposition and lift-off processes (shown in FIG. 11).

Figure 12:
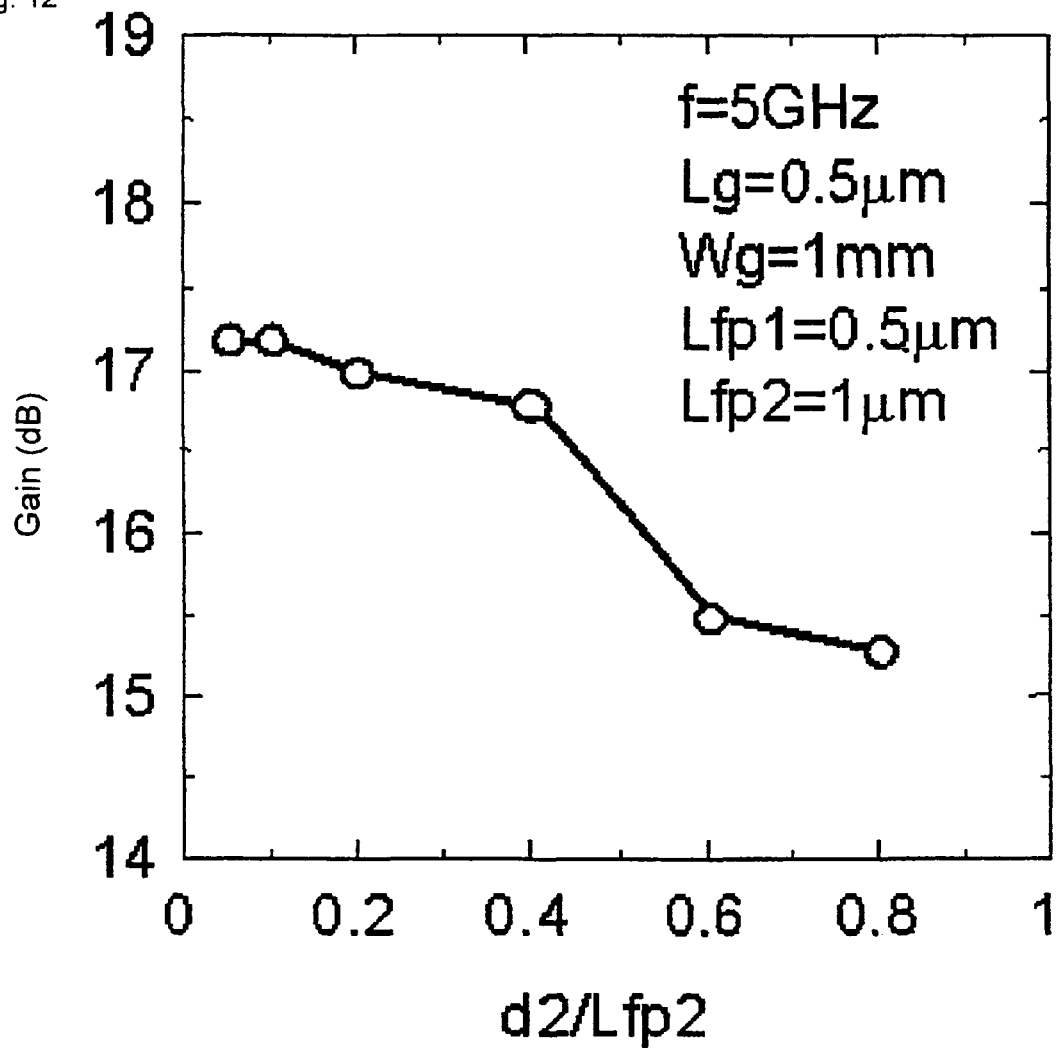
FIG. 12 is a chart showing the relationship between parameters d2, Lfp2 and gain of the transistor evaluated by using plural types of field effect transistors having difference in parameter d2, which were fabricated in Example 5.

FIG. 12 is a chart showing the d2/Lfp2 dependency of linear gain obtained from evaluation results of power performance at an operating frequency 5 GHz measured for the obtained transistors. From FIG. 12, when the relation expressed as d2/Lfp2≦½ holds, shielding effect by the second field plate electrode 118 was more securely exhibited. Thus, by choosing such a structure in which the following relation is satisfied:

$$d2 \leq 0.5 \times Lfp2 \qquad (3),$$

the gain could be further remarkably improved.

Example 6

FIG. 13 is a cross sectional view showing the structure of the field effect transistor of the present example. In the field effect transistor shown in FIG. 13, as the semiconductor substrate 110, a high resistance SiC substrate was used.

As layers corresponding to the nitride semiconductor 111, an AlN buffer layer 131 of 4 nm, a GaN layer 132 of 2000 nm, and an AlGaN layer 133 (Al composition ratio 0.25, thickness 30 nm) were formed in order recited on the substrate 110. Next, Ti and Al were deposited in order recited, and lift-off process was used to form the source electrode 112 and the drain electrode 114. Further, heat treatment was performed at 650° C. under nitrogen atmosphere to thereby form ohmic-contact between these electrodes and the AlGaN layer 133.

Thereafter, a SiN film with the film thickness of 100 nm was formed as the first insulating film 115 between the source electrode 112 and the drain electrode 114, for instance, by means of the plasma CVD method. Further, the region where the gate electrode 113 was to be formed was opened by dry etching to form an opening part with an opening width of 0.5 µm in the gate length direction at the first insulating film 115.

The gate electrode 131 with the gate length Lg=0.5 µm was formed in such a structure which is filling up the opening part and further hanging over the first insulating film 115 by 0.2 µm. As a metal for gate electrode 113, there was formed a Pt (lower layer (substrate side))/Au (upper layer) electrode with a barrier height larger than that of the Ni metal of conventional type and a small gate leakage current. Pt and Au were deposited in order recited, and resist lift-off process was used to form the gate electrode.

Next, a Ti/Pt/Au electrode which is excellent in adhesion with respect to the first insulating film 115 was formed as the first field plate electrode 116. Ti, Pt and Au were deposited in order recited, and lift-off process was performed to form the first field plate electrode 116 of Lfp1=0.8 µm in a manner spaced from the gate electrode 113.

Further, as the second insulating film 117, a SiN film with the film thickness of 150 nm was formed. In a manner in contact with the upper surface of second insulating film 117, there was formed, by deposition and lift-off processes, a Ti/Pt/Au electrode of Lfd=0.4 µm, Lfp2=1.0 µm as the second field plate electrode 118. In the subsequent step of wiring, the second field plate electrode 118 and the source electrode 112 were electrically connected in the isolation region (not shown in the figure).

The obtained transistor exhibited pulse power performance at 5 GHz being equivalent to that of the device of Example 1. Moreover, in the present example, as the result of the fact that metallic materials respectively suitable for the gate electrode 113 and the first field plate electrode 116 were used, performance and yield of the transistor were remarkably improved. Since application of materials optimum for the gate electrode 113 could be made, further increased long-term stability of the device resulted from reduction of gate leakage current.

Moreover, while description has been made above in connection with the transistor in which the gate electrode 113 was formed without recess-etching the AlGaN layer 133, if AlGaN layer 133 is recess-etched before Ni/Au deposition thereafter to form gate electrode 113, a recess gate structure can be obtained. In the transistor constructed in such a structure, a transistor performance with higher gain was obtained.

In the present example, after ohmic-contact was formed, a SiN film with the film thickness of 100 nm was formed as the first insulating film 115 by plasma CVD method, and then a T-shaped gate electrode 113 with the gate length of 0.5 µm was formed at an opening obtained by dry-etching. As another method, after formation of the ohmic electrode, a rectangular gate electrode 113 with the gate length of 0.5 µm may be formed by the deposition and lift-off processes, and a SiN film with the film thickness of 100 nm may be formed as the first insulating film 115, for instance, by using plasma CVD method.

In the following examples, explanation will be made mainly as to points different from Example 6.

Example 7

In the present example, the influence on the shielding effect of the Lfd: cross-section length between the first field plate electrode 116 and the second field plate electrode 118 through an insulating film was examined for the transistor shown in FIG. 13 in similar manner to Example 2. The respective constituent members thereof are as follows:

Substrate 110: high resistance SiC substrate

Layers corresponding to the nitride semiconductor 111: AlN buffer layer 131 (thickness 4 nm), GaN layer 132 (thickness 2000 nm), AlGaN layer 133 (Al composition ratio 0.25, thickness 30 nm)

First insulating film 115: SiN film with film thickness 100 nm

Source electrode 112, drain electrode 114: Ti/Al electrode

Gate electrode 113: gate length Lg=0.5 µm, Pt/Au electrode

First field plate electrode 116: Ti/Pt/Au electrode with Lfg=0.5 µm, Lfp1=0.8 µm Lfd=−0.5 µm, −0.25 µm, +0.25 µm, +0.5 µm, +0.75 µm, +1.0 µm In this case, the gate electrode 113 with gate length Lg=0.5 µm was formed in such a structure hanging over the first insulating film 115 by 0.2 µm. Moreover, Lfg is a distance between the end part of the gate electrode 113 and the end part of the second insulating film 117 covering the first field plate electrode 116 in the cross sectional view in the gate length direction, and is expressed as Lfg=Lfp1+d3.

As the result of the fact that the Lfd dependency of linear gain was determined from the evaluation results of power performance at operating frequency 5 GHz of the obtained transistors, there was a tendency similar to that of Example 2. When the Lfd: cross-section length between the first field plate electrode 116 and the second field plate electrode 118 through an insulating film was a positive value, the effect of the second field plate electrode 118 is much larger as compared to that observed in the case where the cross-section length Lfd was a negative value. Thus, the gain was remarkably improved.

Example 8

In the present example, the relationship between the length Lfp 1 of the first field plate electrode 116 and the length Lfp 2 of the second field plate electrode 118 was examined for the field effect transistor shown in FIG. 13 in similar manner to Example 3. The respective constituent members thereof are as follows. Also in the present example, the gate electrode 113 with gate length Lg=0.5 μm was formed in such a structure hanging over the first insulating film 115 by 0.2 μm.

Substrate 110: high resistance SiC substrate

Layers corresponding to the nitride semiconductor 111: AlN buffer layer 131 (thickness 4 nm), GaN layer 132 (thickness 2000 nm), AlGaN layer 133 (Al composition ratio 0.25, thickness 30 nm)

First insulating film 115: SiN film with film thickness of 100 nm

Source electrode 112, drain electrode 114: Ti/Al electrode

Gate electrode 113: gate length Lg=0.5 μm, Pt/Au electrode, Lgd=4.0 μm

First field plate electrode 116: Ti/Pt/Au electrode with Lfg=0.5 μm, Lfp1=0.3 μm Second insulating film 117: SiN film with film thickness of 200 nm (d3=0.2 μm)

Second field plate electrode 118: Ti/Pt/Au electrode Lfp2=0 μm, 0.1 μm, 0.25 μm, 0.5 μm, 0.75 μm, 1 μm The power performance at operating frequency 5 GHz of the obtained transistors was evaluated to determine the Lfp2 dependency of linear gain. As a result, similarly to the devices of Example 3, with a structure to satisfy the relation expressed as 0.5≦Lfp2/Lfp1 in connection with the ratio between the length Lfp1 of the first field plate electrode 116 and the length Lfp2 of the second field plate electrode 118, shielding effect of lines of electric force is high, so that feedback capacity between the gate electrode and the drain electrode was reduced, and thus, it was possible to obtain remarkable improvement in gain.

In addition, in the present example, there were used metallic materials respectively suitable for the gate electrode 113 and the first field plate electrode 116. Thus, performance and yield of the transistor were remarkably improved.

Example 9

In the present example, the maximum value of the length Lfp2 of the second field plate electrode 118 was examined for the field effect transistor shown in FIG. 13 in similar manner to Example 4. The respective constituent members thereof are as follows. Also in the present example, the gate electrode 113 with gate length Lg=0.5 μm was formed in such a structure hanging over the first insulating film 115 by 0.2 μm.

Substrate 110: high resistance SiC substrate

Layers corresponding to the nitride semiconductor 111: AlN buffer layer 131 (thickness 4 nm), GaN layer 132 (thickness 2000 nm), AlGaN layer 133 (Al composition ratio 0.25, thickness 30 nm)

First insulating film 115: SiN film with film thickness of 100 nm

Source electrode 112, drain electrode 114: Ti/Al electrode

Gate electrode 113: gate length Lg=0.5 μm, Pt/Au electrode, Lgd=4.0 μm

First field plate electrode 116: Ti/Pt/Au electrode with Lfg=0.5 μm, Lfp1=0.3 μm Second insulating film 117: SiN film with film thickness of 200 nm (d3=0.2 μm)

Second field plate electrode 118: Ti/Pt/Au electrode with Lfd=+0.75 μm

Lfp2=0 μm, 0.3 μm, 0.9 μm, 1.7 μm and 2.3 μm

As the result of the evaluation of the breakdown voltage of the obtained transistor, the result of which tendency is similar to that of Example 4 was obtained.

By employing a structure to satisfy Lfp1+Lfp2+d3≦⅗×Lgd, it is possible to still further improve breakdown voltage. It is considered that this is because electric field concentration at the drain side end of the second field plate electrode 118 is further suppressed within the range where Lfp1+Lfp2+d3 is not more than ⅗×Lgd with respect to Lgd (=4.0 μm) as compared to the range where Lfp1+Lfp2+d3 is more than ⅗×Lgd so that breakdown voltage is improved.

In addition, also in the present example, as the result of the fact that metallic materials respectively suitable for the gate electrode 113 and the first field plate electrode 116 were used, performance and yield of the transistor were remarkably improved.

Example 10

In the present example, the length Lfp2 of the second field plate electrode 118 and the thickness d2 of the second insulating film 117 were examined for the transistor shown in FIG. 13 in similar manner to Example 5. The structures of respective members are as follows. Also in the present example, the gate electrode 113 with gate length Lg=0.5 μm was formed in such a structure hanging over the first insulating film 115 by 0.2 μm.

Substrate 110: high resistance SiC substrate

Layers corresponding to the nitride semiconductor 111: AlN buffer layer 131 (thickness 4 nm), GaN layer 132 (thickness 2000 nm), AlGaN layer 133 (Al composition ratio 0.25, thickness 30 nm)

First insulating film 115: SiN film with film thickness of 100 nm

Source electrode 112, drain electrode 114: Ti/Al electrode

Gate electrode 113: gate length Lg=0.5 μm, Pt/Au electrode

First field plate electrode 116: Ti/Pt/Au electrode with Lfp1=0.8 μm

Second insulating film 117: $SiO_2$ film with variety of films thicknesses of 0.1 μm, 0.3 μm, 0.5 μm and 0.7 μm Second field plate electrode 118: Ti/Pt/Au electrode with Lfp2=1.0 μm Moreover, there was fabricated a device in which a portion of a device in which the thickness of the $SiO_2$ film of the second insulating film 117 was set to 0.1 μm was divided to remove the $SiO_2$ film by etching. Further, there was also fabricated a sample in which the thickness of the $SiO_2$ film of the second insulating film 117 was set to 0.1 μm, and from the thickness of 100 nm of the first insulating film 115, a part with 50 nm thickness is removed by etching, and then on the upper layer thereof, a Ti/Pt/Au electrode with Lfp2=1.0 μm was formed as the second field plate electrode 118 by deposition and lift-off processes (shown in FIG. 15).

With respect to the obtained transistor, the d2/Lfp2 dependency of linear gain was examined by evaluation of the power performance at an operating frequency of 5 GHz. As a result, a tendency similar to that of Example 5 was confirmed. When the relation expressed as d2/Lfp2≦½ holds, shielding effect by the second field plate electrode 118 was exhibited, and thus, remarkable improvement in gain was made.

Moreover, in the present example, as the result of the fact that metallic materials respectively suitable for the gate electrode 113 and the first field plate electrode 116 were used, performance and yield of the transistor were remarkably improved.

Further, while description has been made above in connection with the transistor in which the gate electrode 113 was formed without recess-etching the AlGaN layer 133, if AlGaN layer 133 is recess-etched before Ni/Au deposition thereafter to form gate electrode 113, a transistor performance with higher gain was obtained.

The present invention has been described by referring to the exemplary embodiments and the examples. These exemplary embodiments are taken as illustrative purpose, and a person skilled in the art can understand that various modified embodiments may be employed for combinations of respective components or respective processes for treatment, and that such modified embodiments fall within the technical scope of the present invention.

For example, while description has been made in the aforementioned examples by taking an example of the case where SiC is used as the material of the substrate 110, there may be also used, in addition to the above, substrate made of different types of substrate materials such as sapphire, or substrate made of a Group III nitride semiconductor such as GaN or AlGaN.

Moreover, as the structure of the semiconductor layer lying under the gate electrode 113, various forms of structures may be employed without being limited to the structure illustrated. For example, there may be also employed a structure in which the AlGaN layer 133 functioning as an electron supply layer is provided in combination not only above the GaN layer 132 functioning as a channel layer, but also below thereof.

Further, an intermediate layer or a capping layer may be provided at the semiconductor layer structure as occasion demands. For example, the layer structure made of Group III nitride semiconductor may be constructed in such a structure in which a channel layer containing $In_xGa_{1-x}N$ ($0 \leq x \leq 1$), an electron supply layer containing $Al_yGa_{1-y}N$ ($0 \leq y \leq 1$), and a capping layer containing GaN are layered up in order recited. By employing such a structure, effective Schottky barrier height can be increased. Thus, higher gate breakdown voltage can be realized. It is to be noted that setting is made such that both x and y do not become equal to zero in the aforementioned formulas.

Furthermore, in the exemplary embodiments and the examples which have been described above, there may be employed a so-called a gate recess structure in which a portion of the lower part of the gate electrode 113 is buried in the AlGaN supply layer 133 functioning as the electron supply layer. Thus, excellent gate breakdown voltage can be obtained.

Still further, in the exemplary embodiments and the examples which have been described, the distance between the gate electrode 113 and the drain electrode 114 can be longer than the distance between the gate electrode 113 and the source electrode 112. This structure is a so-called "offset structure". Thus, it is possible to more effectively relieve electric field concentration at the end part on the drain electrode side of the gate electrode 113.

In addition, the field effect transistors disclosed in the aforementioned exemplary embodiments and examples are used as components comprised in an amplifier circuit or an oscillating circuit, for example. Since satisfactory high frequency characteristic is required in such a use, the advantages of the FETs of the present invention are exhibited at the maximum.

The invention claimed is:

1. A field effect transistor, comprising:
   a layer structure made of Group III nitride semiconductor comprising hetero-junction;
   a source electrode and a drain electrode formed on the layer structure made of Group III nitride semiconductor with a space separating each other;
   a gate electrode placed between the source electrode and the drain electrode;
   a first field plate placed over the layer structure made of Group III nitride semiconductor in a region between the gate electrode and the drain electrode, and isolated from the layer structure made of Group III nitride semiconductor; and
   a second field plate placed over the layer structure made of Group III nitride semiconductor, and isolated from the layer structure made of Group III nitride semiconductor and the first field plate,
   wherein the first field plate is biased at the same electric potential as that of the gate electrode, the second field plate is biased at the same electric potential as that of the source electrode, the second field plate comprises a shielding part located in a region between the first field plate and the drain electrode, and serving to shield the first field plate from the drain electrode, and an upper end of the shielding part is located above an upper surface of the first field plate,
   whereby, in a cross sectional view in the gate length direction, when a length in a gate length direction of an overlap region where the second field plate overlaps an upper part of a structure comprising the first field plate and the gate electrode is designated as Lol and a gate length is designated as Lg, the relation expressed below is satisfied:

$0 < Lol/Lg \leq 1$;

wherein the field effect transistor further comprises a first insulating film for covering a surface of the layer structure made of Group III nitride semiconductor in the region between the gate electrode and the drain electrode, and
   wherein the first insulating film is a film containing nitrogen.

2. The field effect transistor as claimed in claim 1, wherein the lower end of the shielding part is located nearer to the surface of the layer structure made of Group III nitride semiconductor than the lower end of the first field plate.

3. The field effect transistor as claimed in claim 2, further comprising:
   a first insulating film for covering a surface of the layer structure made of Group III nitride semiconductor in the region between the gate electrode and the drain electrode,
   wherein a recessed part is provided at the first insulating film in the region between the first field plate and the drain electrode, and
   the first field plate is provided in a manner in contact with a upper surface of the first insulating film, and the lower end of the shielding part is located within the recessed part.

4. The field effect transistor as claimed in claim 1, wherein the lower end of the first field plate is located nearer to the surface of the layer structure made of Group III nitride semiconductor than the lower end of the shielding part.

5. The field effect transistor as claimed in claim 4, comprising:
   a first insulating film for covering a surface of the layer structure made of Group III nitride semiconductor in the region between the gate electrode and the drain electrode; and
   a second insulating film provided on the first insulating film in the region between the first field plate and the drain electrode,
   wherein the first field plate is provided in a manner in contact with a upper surface of the first insulating film, and the lower end of the shielding part is in contact with a upper surface of the second insulating film.

6. The field effect transistor as claimed in claim 1, wherein the first field plate is integrally constructed together with the gate electrode in the monolithic shape.

7. The field effect transistor as claimed in claim 1, wherein the first field plate comprises an electric field control electrode provided in a manner spaced from the gate electrode.

8. The field effect transistor as claimed in claim 1, wherein the second field plate shows some overlap with the first field plate, and the second field plate is free from overlapping with the gate electrode.

9. The field effect transistor as claimed in claim 1, wherein, in a cross sectional view in the gate length direction, when an extension width in the gate length direction of the first field plate from the gate electrode end part toward the drain electrode is designated as $Lfp1$, and a length in the gate length direction of a lower surface of the second field plate is designated as $Lfp2$, the formula (1) expressed below is satisfied:

$$0.5 \times Lfp1 \leq Lfp2 \quad (1).$$

10. The field effect transistor as claimed in claim 1, wherein the second field plate is provided in a manner in contact with an insulating film for covering a side surface of the first field plate, whereby the aforementioned structure is constructed in the following structure:

in the cross sectional view in the gate length direction, when an extension width in the gate length direction of the first field plate from the gate electrode end part toward the drain electrode is designated as $Lfp1$;

a length in the gate length direction of a lower surface of the second field plate is designated as $Lfp2$;

a distance between the gate electrode and the drain electrode is designated as $Lgd$; and a thickness of the insulating film at a side surface of the first field plate is designated as $d3$, the formulas (1) and (2) expressed below are satisfied:

$$0.5 \times Lfp1 \leq Lfp2 \quad (1)$$

$$Lfp1 + Lfp2 + d3 \leq \tfrac{3}{5} \times Lgd, \quad (2)$$

11. The field effect transistor as claimed in claim 1, wherein there is employed a structure in which, in the cross sectional view in the gate length direction, when a length in the gate length direction of a lower surface of the second field plate is designated as $Lfp2$, and a distance between a lower surface of the second field plate in a region between the first field plate and the gate electrode and the layer structure made of Group III nitride semiconductor is designated as $d2$, the formula (3) expressed below is satisfied:

$$d2 \leq 0.5 \times Lfp2 \quad (3).$$

12. The field effect transistor as claimed in claim 7, wherein the first field plate is free from overlapping with the gate electrode.

13. The field effect transistor as claimed in claim 1, wherein, in a cross sectional view in the gate length direction, when an extension width in the gate length direction of the first field plate from the gate electrode end part toward the drain electrode is designated as $Lfp1$, the relation expressed below is satisfied:

$$0 < Lfp1/Lg < Lol/Lg \leq 1.$$

14. The field effect transistor as claimed in claim 1, wherein the relation expressed below is satisfied:

$$0 < Lol/Lg \leq 0.7.$$

15. A field effect transistor, comprising:
a layer structure made of Group III nitride semiconductor comprising hetero-junction;
a source electrode and a drain electrode formed on the layer structure made of Group III nitride semiconductor with a space separating each other;
a gate electrode placed between the source electrode and the drain electrode;
a first field plate placed over the layer structure made of Group III nitride semiconductor in a region between the gate electrode and the drain electrode, and isolated from the layer structure made of Group III nitride semiconductor; and
a second field plate placed over the layer structure made of Group III nitride semiconductor, and isolated from the layer structure made of Group III nitride semiconductor and the first field plate,
wherein the first field plate is biased at the same electric potential as that of the gate electrode, the second field plate is biased at the same electric potential as that of the source electrode, the second field plate comprises a shielding part located in a region between the first field plate and the drain electrode, and serving to shield the first field plate from the drain electrode, and an upper end of the shielding part is located above an upper surface of the first field plate,
whereby, in a cross sectional view in the gate length direction, when a length in a gate length direction of an overlap region where the second field plate overlaps an upper part of a structure comprising the first field plate and the gate electrode is designated as $Lol$ and a gate length is designated as $Lg$, the relation expressed below is satisfied:

$$0 < Lol/Lg \leq 1;$$

wherein each of the source, drain, and gate electrodes being formed on a common surface of the layer structure made of Group III nitride semiconductor.

* * * * *